(12) United States Patent
Okugawa

(10) Patent No.: US 9,319,798 B2
(45) Date of Patent: Apr. 19, 2016

(54) CAPACITIVE TRANSDUCER

(71) Applicant: OMRON Corporation, Kyoto-shi, Kyoto (JP)

(72) Inventor: Akihiro Okugawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/623,217

(22) Filed: Feb. 16, 2015

(65) Prior Publication Data

US 2015/0264462 A1    Sep. 17, 2015

(30) Foreign Application Priority Data

Mar. 14, 2014    (JP) ................. 2014-051902

(51) Int. Cl.

| | |
|---|---|
| *H04R 25/00* | (2006.01) |
| *H04R 19/00* | (2006.01) |
| *H04R 19/01* | (2006.01) |
| *H04R 23/00* | (2006.01) |
| *H04R 19/04* | (2006.01) |
| *H04R 31/00* | (2006.01) |

(52) U.S. Cl.
CPC ............ *H04R 19/005* (2013.01); *H04R 19/016* (2013.01); *H04R 19/04* (2013.01); *H04R 23/006* (2013.01); *H04R 31/00* (2013.01); *H04R 2201/003* (2013.01)

(58) Field of Classification Search
CPC ...... H04R 7/26; H04R 19/005; H04R 19/016; H04R 19/04; H04R 23/006; H04R 2201/003; B81B 3/007; B81B 2201/0264

USPC ......... 381/113, 116, 173, 174, 175, 191, 369; 367/170, 181; 257/416; 438/53
See application file for complete search history.

(56) References Cited

U.S. PATENT DOCUMENTS

| | | | |
|---|---|---|---|
| 6,535,460 B2* | 3/2003 | Loeppert ............... | B81B 3/0072 367/181 |
| 7,907,744 B2 | 3/2011 | Kasai et al. | |
| 8,625,823 B2* | 1/2014 | Buck .................... | H04R 19/005 381/174 |
| 2011/0227177 A1* | 9/2011 | Nakatani ................. | B81B 3/007 257/416 |
| 2014/0210020 A1* | 7/2014 | Dehe ....................... | B81B 3/007 257/416 |

FOREIGN PATENT DOCUMENTS

| | | |
|---|---|---|
| JP | 2006-157863 A | 6/2006 |
| JP | 2010-074523 A2 | 4/2010 |

\* cited by examiner

*Primary Examiner* — Huyen D Le
(74) *Attorney, Agent, or Firm* — Osha Liang LLP

(57) ABSTRACT

A capacitive transducer has a back plate including a fixed electrode, a diaphragm facing the back plate with an air gap interposed therebetween, the diaphragm acting as a movable electrode, at least a first stopper of a first protruding length, and a second stopper of a second protruding length. The first and second stoppers protrude from at least either the surface on the back plate near the air gap or the surface on the diaphragm near the air gap. The first stopper is provided at a position corresponding to a first position on the diaphragm. The second the stopper is provided at a position corresponding to a second position on the diaphragm. An amount of displacement of the diaphragm at the first position is greater than an amount of displacement of the diaphragm at the second position. The protruding length of the first stopper is shorter than the protruding length of the second stopper.

16 Claims, 21 Drawing Sheets

CAPACITIVE TRANSDUCER

BACKGROUND

1. Field

The present invention relates to a capacitive transducer, and more specifically relates to a capacitive acoustic sensor.

2. Related Art

One type of capacitive transducer is an acoustic sensor that may be used in a microphone. The acoustic sensor is constructed from a diaphragm (an oscillating electrode plate), and a fixed electrode plate arranged opposite each other with a tiny gap (space) interposed therebetween. The diaphragm is formed from a thin-film about 1 µm thick; therefore, the diaphragm will make minute oscillations in response to the acoustic pressure impinging thereon. Acoustic vibrations may be detected by detecting the change in capacitance when the diaphragm vibrates because the oscillation of the oscillating electrode plate changes the size of the gap between the oscillating electrode plate and the opposing electrode.

For an acoustic sensor constructed in this manner, when the diaphragm 11 flexes greatly and comes in contact with the fixed electrode plate 12, the diaphragm adheres to the fixed electrode plate 12 and no longer returns to its original position as exemplified in FIG. 1A. This phenomenon is called "sticking". This sticking of the diaphragm may be caused when, for example, a large sound wave impinges on the diaphragm; a large amount of compressed air (air pressure) impinges on the diaphragm in an acoustic sensor during a drop test; or air is drawn forcefully into the acoustic sensor. The sticking may also occur while manufacturing the acoustic sensor.

When the diaphragm sticks to the fixed electrode plate in this manner, this inhibits the vibration of the diaphragm, and thus the acoustic sensor is no longer capable of detecting acoustic vibrations. Therefore, it is necessary to prevent this kind of sticking. Japanese Unexamined Patent Application Publication No. 2006-157863 discloses an acoustic sensor for addressing this issue. The acoustic sensor is provided with a plurality of stoppers, which are bumps on the surface of the fixed electrode facing the diaphragm. In general the stoppers are provided spaced equally over the entire surface of the fixed electrode plate; if the stoppers are made as thin as possible, then the contact surface area between the diaphragm and the fixed electrode plate (or, the stopper) is reduced, and the diaphragm tends not to stick to the fixed electrode plate.

However, in order to provide a stopper in the acoustic sensor so that the diaphragm does not stick, it is necessary to adjust the spacing between stoppers. FIG. 1B to FIG. 1D schematically illustrate the state of the diaphragm 11 in cases where the spacing between stoppers 13 is too large, is suitable, and is too small respectively. In FIG. 1C the spacing D between stoppers 13 is suitable. In this case, even if the diaphragm 11 adheres to the fixed electrode plate 12, as illustrated by the double-dotted dash lines in FIG. 1C, the diaphragm tends not to stick because the contacts surface area between the stoppers 13 and the diaphragm 11 is small; further, as illustrated by the solid line in FIG. 1C, the diaphragm 11 returns to its original position using its own elastic restorative force.

In contrast, as illustrated in FIG. 1B, the spacing d between the stoppers 13 is narrower than when the spacing is suitable; in this case, even if the stoppers 13 are thin and the surface area of the tips are small, there is a limit to the minimization of the tip end surface of the stoppers, and therefore the total surface area of the tip end surface comprising the overall stoppers becomes large and as a result, in this case, the diaphragm 11 sticks to the tip end surfaces of the stoppers 13 spanning a almost the entire surface or a wide region, and thus the diaphragm 11 sticks to the stoppers 13.

As illustrated in FIG. 1D, when the spacing d between stoppers 13 is wider than the suitable spacing, even if the diaphragm 11 comes in contact with the stoppers 13, a portion of the diaphragm 11 falls through between adjacent stoppers 13 and comes in contact with the fixed electrode plate 12. When the diaphragm 11 sticks to the fixed electrode plate 12 in this manner, even if there is only one contact portion, the contact surface area tends to be much larger than the tip end surface area of the stoppers 13, and therefore the diaphragm 11 sticks to the fixed electrode 12.

As a result, a conventional acoustic sensor is prone to sticking whether the spacing between stoppers is too large or too small, and thus it is necessary to provide stoppers 13 so that a suitable spacing is formed.

Moreover, the length of the stoppers (the protruding length), influences the tendency for the diaphragm to break (anti-breaking property), and the tendency for the diaphragm to stick (anti-sticking property). This influence will be described using FIG. 2. In the acoustic sensor illustrated in FIG. 2, stoppers 13 protrude from a back plate 14 supporting the fixed electrode 12.

If the stoppers are short, as illustrated in FIG. 2A, the diaphragm 11 deforms to a large extent, because there is wide spacing between the undeformed diaphragm 11 and the stoppers 13. Therefore, the diaphragm 11 acquires a large elastic restorative force when the diaphragm abuts the stopper 13, and the diaphragm 11 tends not to stick. However, when the stoppers 13 are short, if the diaphragm 11 is subject to an excessive amount of pressure the diaphragm 11 deforms to a large extent and tends to break, because there is wide spacing between the diaphragm 11 and the stoppers 13. Particularly the sections near where the diaphragm 11 is fixed tend to break when there is a large deformation of the diaphragm 11.

If the stoppers are long, as illustrated in FIG. 2B, the maximum displacement of the diaphragm 11 is small because of the narrow spacing between the undeformed diaphragm 11 and the stopper 13, and the diaphragm 11 tends not to break. However, when the stoppers are long, the diaphragm 11 acquires a small elastic restorative force when the diaphragm 11 abuts the stoppers 13 and tends to stick because there is a narrow spacing between the diaphragm 11 and the stoppers 13.

Consequently, stoppers constructed in the conventional manner provide a trade-off between the desire to improve the anti-sticking and the anti-breaking properties of the diaphragm even when there is a suitable spacing between stoppers.

SUMMARY

One or more embodiments of the present invention provides a capacitive transducer capable of improving both the anti-sticking, and the anti-breaking properties of the diaphragm.

A capacitive current transducer according to one or more embodiments of the present invention is provided with a back plate including a fixed electrode, a diaphragm functioning as a movable electrode arranged facing the back plate with an air gap interposed therebetween, at least a first stopper of a first protruding length, and a second stopper of a second protruding length provided on at least one surface of the back plate near the air gap, or the surface of the diaphragm near the air gap. The first stopper is provided at a position corresponding to a first position on the diaphragm; the second stopper is provided at a position corresponding to a second position on the diaphragm. The amount of displacement of the diaphragm at the first position is larger than the amount of displacement of the diaphragm at the second position, and the protruding length of the first stopper is shorter than the protruding length of the second stopper.

In the capacitive transducer according to one or more embodiments of the invention, a first stopper of comparatively short protruding length is provided at a position corresponding to a first position where the amount of displacement of the diaphragm is comparatively large; a second stopper of comparatively long protruding length is provided at a position corresponding to a second position where the amount of displacement of the diaphragm is comparatively small. Consequently, a first stopper of comparatively short protruding length is provided at a position corresponding to a first position where the amount of displacement of the diaphragm is comparatively large, and thus, when the diaphragm abuts the first stopper, the diaphragm may undergo a large displacement and acquire a large elastic restorative force. Accordingly, the diaphragm tends not to stick to the stopper. Furthermore, a second stopper of comparatively long protruding length is provided at a position corresponding to a second position where the amount of displacement of the diaphragm is comparatively small, and thus, when a diaphragm is subject to a pressure resulting in a large load at locations of diaphragm that undergo a small displacement (i.e., locations at which stress is likely to be concentrated such as portions near where the diaphragm is fixed), the diaphragm may be configured so that the second stoppers abut these locations, thereby preventing the diaphragm from breaking.

A capacitive transducer according to one or more embodiments of the invention is configured such that a region of the fixed electrode facing the diaphragm is configured as a flat surface.

A capacitive transducer according to one or more embodiments of the invention may be configured such that the first position is at the outer peripheral portion of the diaphragm, and the second position is at the center portion of the diaphragm.

A capacitive transducer according to one or more embodiments of the invention may be configured such that the first position is inside a circle defined on the diaphragm, and the second position is outside the circle.

A capacitive transducer according to one or more embodiments of the invention may be provided with a plurality of stoppers including the first stopper and the second stopper; where, if the distance from the center of the diaphragm to the location at which the diaphragm is fixed is R, a plurality of stoppers including the first stopper is provided inside a first region corresponding to the region of the radius R/2 with the center of the diaphragm as the center; a plurality of stoppers including the second stopper is provided in a second region corresponding to an outer portion of said radius region, and the protruding length of the shortest stopper in the first region is shorter than the protruding length of the longest stopper in the second region.

A capacitive transducer according to one or more embodiments of the invention may be configured such that the diaphragm is fixed at the entire outer periphery or a portion of the outer periphery, the first stopper is provided near the center of the diaphragm, and the second stopper is provided near a portion of the diaphragm that is fixed.

A capacitive transducer according to one or more embodiments of the invention may be configured such that the first position is a region where the diaphragm undergoes a large displacement, the first stopper protrudes from the back plate at a position facing to the first position, the second position is a region where the diaphragm undergoes a small displacement, and the second stopper protrudes from the back plate at a position facing to the second position.

A capacitive transducer according to one or more embodiments of the invention may be configured such that the first position is a region where the diaphragm undergoes a large displacement, the first stopper protrudes from the back plate at the first position, the second position is a region where diaphragm undergoes a small displacement, and the second stopper protrudes from the diaphragm at the second position.

A capacitive transducer according to one or more embodiments of the invention may be configured such that a plurality of stoppers including the first stopper and the second stopper protrude from the back plate, the protruding length of the stoppers is selected such that the tips of the plurality of stoppers line up along the shape of the diaphragm when the diaphragm deforms.

A capacitive transducer according to one or more embodiments of the invention may be configured such that the second stopper is thicker than the first stopper. While the stress concentrates on the portion of the diaphragm in contact with the second stopper because the second stopper has a longer protruding length, the thicker second stopper increases the contact surface area with the diaphragm, to thus disperse the stress at the contact surface.

A capacitive transducer according to one or more embodiments of the invention may be provided with a plurality of stoppers including a first stopper and a second stopper; the density of the number of stoppers near the second stopper may be greater than the density of the number of stoppers near the first stopper. While the stress concentrates on the portion of the diaphragm in contact with the second stopper for the second stopper having a long protruding length, the increased density of the second stoppers increases the contact surface area of the second stoppers with the diaphragm to thus disperse the stress of the contact surface.

A capacitive transducer according to one or more embodiments of the invention may be provided with acoustic holes which allow acoustic vibrations pass through to the back plate thereby allowing the capacitive transducer to be used as an acoustic sensor. Additionally, such an acoustic sensor according to one or more embodiments of the invention maybe combined with a circuit to thus be used as a microphone.

The above described constituent elements may be combined in any appropriate manner, and numerous variations of the invention are possible by combining the constituent elements.

According to one or more embodiments of the present invention, the diaphragm tends not to stick to the stopper and has an improved anti-sticking property even when the diaphragm is subject to a large load. Moreover, when the diaphragm is subject to a large load, it is possible to prevent a large amount of stress from concentrating on the diaphragm to thereby improve the anti-breaking property of the capacitive transducer.

DETAILED DESCRIPTION

Embodiments of the invention are described below with reference to the attached drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. Note that the present invention is not limited to the embodiments described below, and the designs thereof may be modified in various ways insofar as the modifications are within the spirit and the scope of the invention.

First Embodiment

Figure 3:
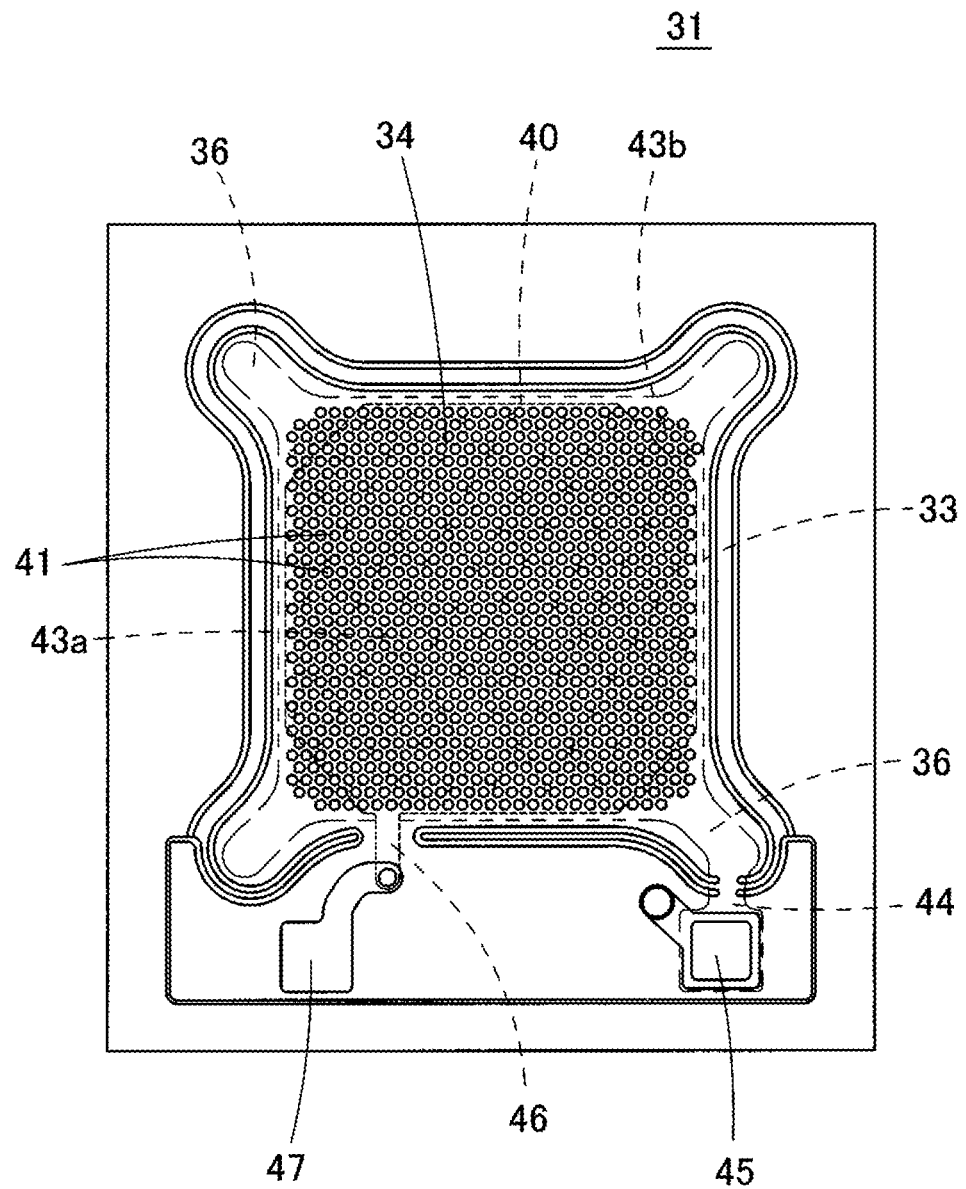
FIG. 3 is a plan view of an acoustic sensor according to the first embodiment.
Figure 4:
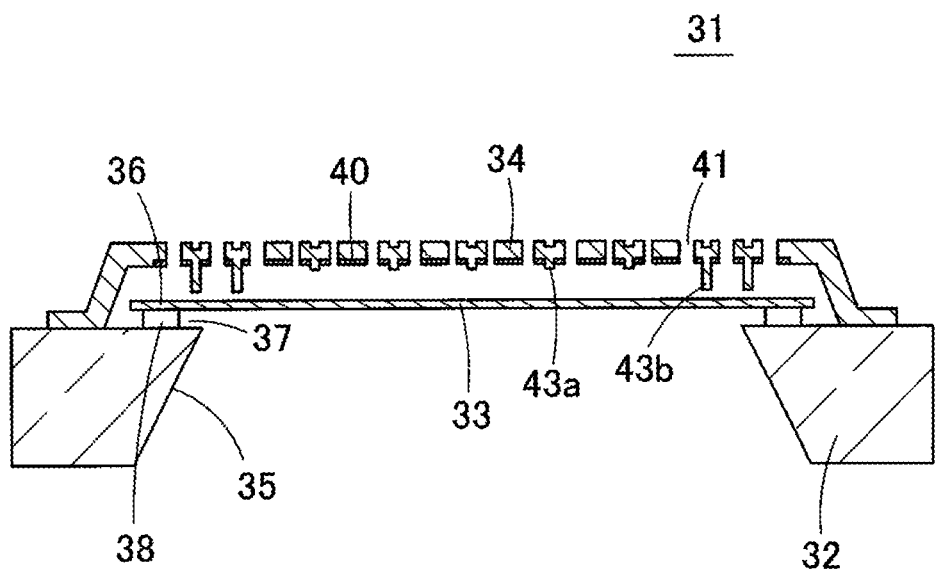
FIG. 4 is a schematic cross-sectional view of the acoustic sensor illustrated in FIG. 3.
Figure 5:
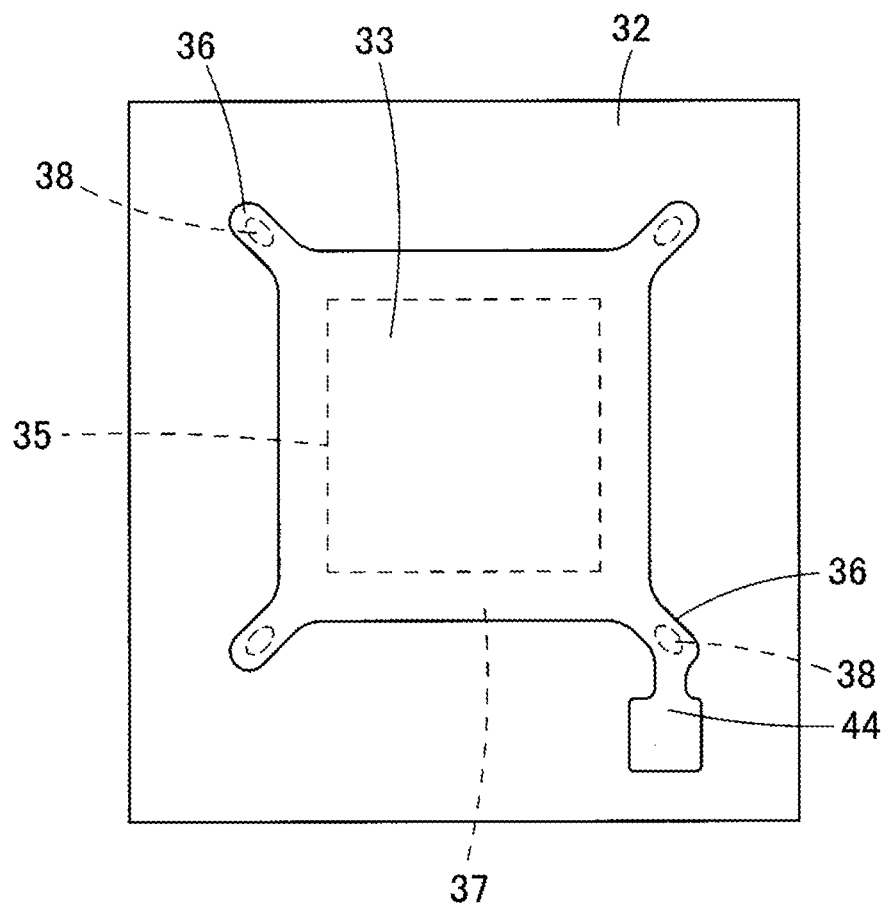
FIG. 5 is a plan view illustrating a diaphragm provided on the top surface of a substrate in the acoustic sensor illustrated in FIG. 3.

The structure of an acoustic sensor 31 according to the first embodiment is described with reference to FIG. 3 to FIG. 5. FIG. 3 is a plan view illustrating the acoustic sensor 31 according to the first embodiment. FIG. 4 is a schematic cross-sectional view of the acoustic sensor 31. FIG. 5 is a plan view illustrating the shape of a diaphragm 33 (movable electrode) formed over the upper surface of a substrate 32.

The acoustic sensor 31 is a capacitive transducer manufactured using MEMS technology. A movable electrode, that is the diaphragm 33 is formed on a substrate 32 such as a silicon substrate in the acoustic sensor 31, as illustrated in FIG. 4; a back plate 34 is provided above the diaphragm 33 with a minute air gap (space) interposed therebetween.

A cavity 35 is opened in the substrate 32 passing through from the front surface to the underside of the substrate. The cavity 35 may be formed as a back chamber- or a front chamber depending on how the acoustic sensor 31 will be used. The wall surfaces of the cavity 35 may be inclined to taper, or may be formed as planes orthogonal to the upper surface of the substrate 32.

The diaphragm 33 is formed from a conductive polysilicon thin-film. As illustrated in FIG. 3, the diaphragm 33 is formed as a substantially square shape, where leg pieces 36 extend horizontally from each corner towards each opposite corner. The diaphragm 33 is arranged above the upper surface of the substrate 32 to cover the upper surface of the cavity 35; the lower surfaces of the leg pieces 36 are supported on anchors 38. Thus, the diaphragm 33 is disposed above the upper surface of the substrate 32 spaced apart from the upper surface of the substrate 32.

As illustrated in the drawings, a narrow space, that is a vent hole 37 is formed between the under surface of the diaphragm 33 and the upper surface of the substrate 32 surrounding the cavity 35 to allow acoustic vibrations or air to pass through. The vent hole 37 is formed between the leg pieces 36 along the portion of the diaphragm 33 facing the upper surface of the substrate 32.

A back plate 34 composed of SiN is provided on the upper surface of the substrate 32. The back plate 34 is formed as a substantially square dome that covers the diaphragm 33 over the cavity portion. The under surface of the back plate 34 is provided with a fixed electrode plate 40 (fixed electrode) made from polysilicon and arranged facing the diaphragm 33. The back plate 34 and the fixed electrode plate 40 constitute the fixed electrode structure.

A minute air gap (space) is formed between under surface of the fixed electrode plate 40 and the upper surface of the diaphragm 33. The fixed electrode plate 40 and the diaphragm 33 face each other to form a variable capacitor that detects acoustic vibrations and converts the vibrations to electrical signals.

Multiple holes, that is multiple acoustic holes 41 for transmitting acoustic vibrations are formed passing the through from the upper surface to the under surface across substantially the entire back plate 34 and fixed electrode plate 40. As illustrated in FIG. 3, the acoustic holes 41 are arranged regularly, and in the example illustrated, the acoustic holes 41 are arranged to form a triangle along three directions forming angles of 60° or 120° with each other; the center of each acoustic hole 41 is arranged regularly to have a constant pitch.

As illustrated in FIG. 4, the under surface of the back plate 34 is provided with multiple minute columnar protrusions, that is, stoppers 43a, 43b; the stoppers 43a, 43b pass through the fixed electrode plate 40 and protrude downward. In other words the stoppers 43a, 43b protrude toward the air gap between the diaphragm 33 and the fixed electrode plate 40. The stoppers 43a, 43b are insulating, and made of SiN, similar to the back plate 34.

As illustrated in FIG. 3 and FIG. 5, the leg piece 36 of the diaphragm 33 has a lead 44 extending therefrom; the lead 44 is electrically connected to the electrode pad 45. The fixed electrode plate 40 similarly has a lead 46 extending therefrom; the lead 46 electrically connects with the electrode pad 47.

The acoustic sensor 31 has the above-mentioned configuration, and when acoustic vibrations cause the diaphragm 33 to vibrate, the capacitance between the diaphragm 33 and the fixed electrode plate 40 varies thereby causing the acoustic sensor 31 to convert the acoustic vibrations to electrical signals and output the electrical signals.

Figure 1A:
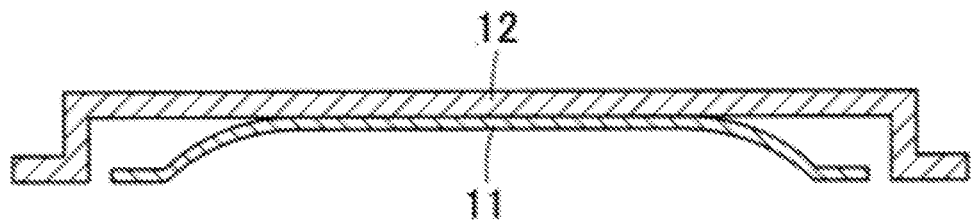
FIG. 1A is a schematic cross-sectional view illustrating the state of the diaphragm when the diaphragm in a conventional acoustic sensor sticks to the fixed electrode plate.
Figure 1B:
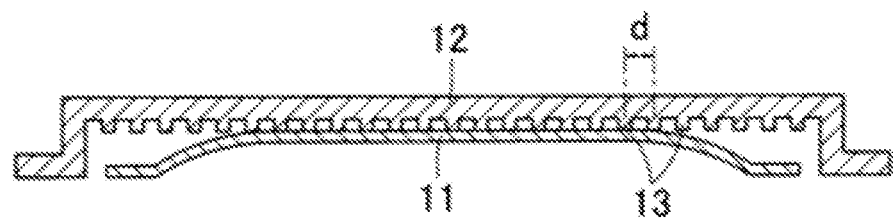
FIG. 1B is a schematic cross-sectional view illustrating an acoustic sensor with narrow spacing between the stoppers.
Figure 1C:
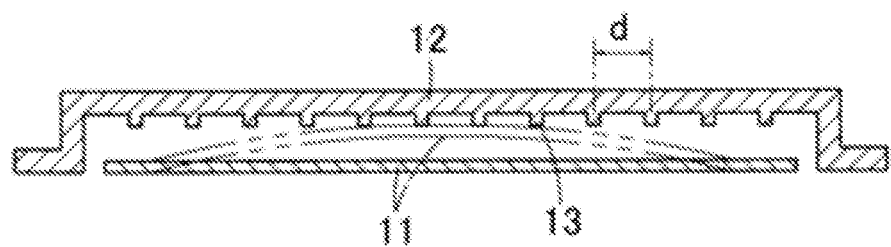
FIG. 1C is a schematic cross-sectional view illustrating the acoustic sensor with the appropriate spacing between stoppers.
Figure 1D:
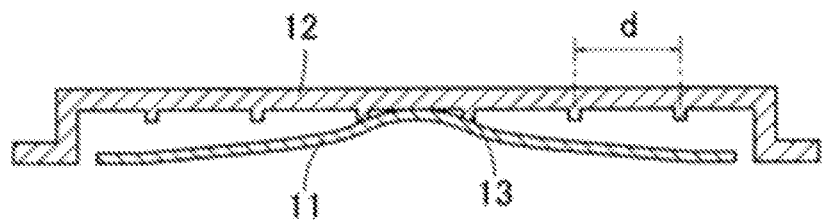
FIG. 1D is a schematic cross-sectional view illustrating the acoustic sensor where the spacing between the stoppers is wide.

The stopper is a feature of the acoustic sensor 31. The stoppers 43a, 43b are provided to prevent the diaphragm 33 from adhering to the fixed electrode plate 40 (refer to FIG. 1B and FIG. 1D). To prevent sticking, the stoppers 43a, 43b are arranged substantially regularly with an appropriate spacing. The stopper 43a is provided in a region facing the region on the diaphragm 33 where there is a comparatively large displacement; the protruding length of the stopper 43a is shorter than the protruding length of the stopper 43b. The stopper 43b is provided in a region facing the region on the diaphragm 33 where there is a comparatively small displacement; the protruding length of the stopper 43b is longer than the protruding length of the stopper 43a.

Figure 6:
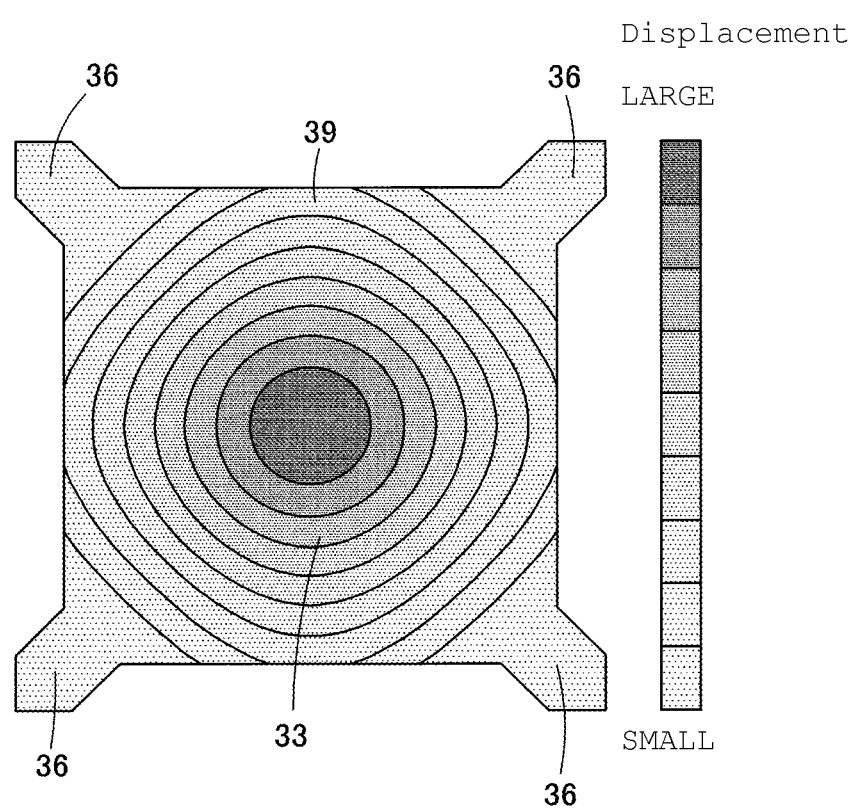
FIG. 6 is a graph illustrating the distribution of displacement when the diaphragm flexes.
Figure 7:
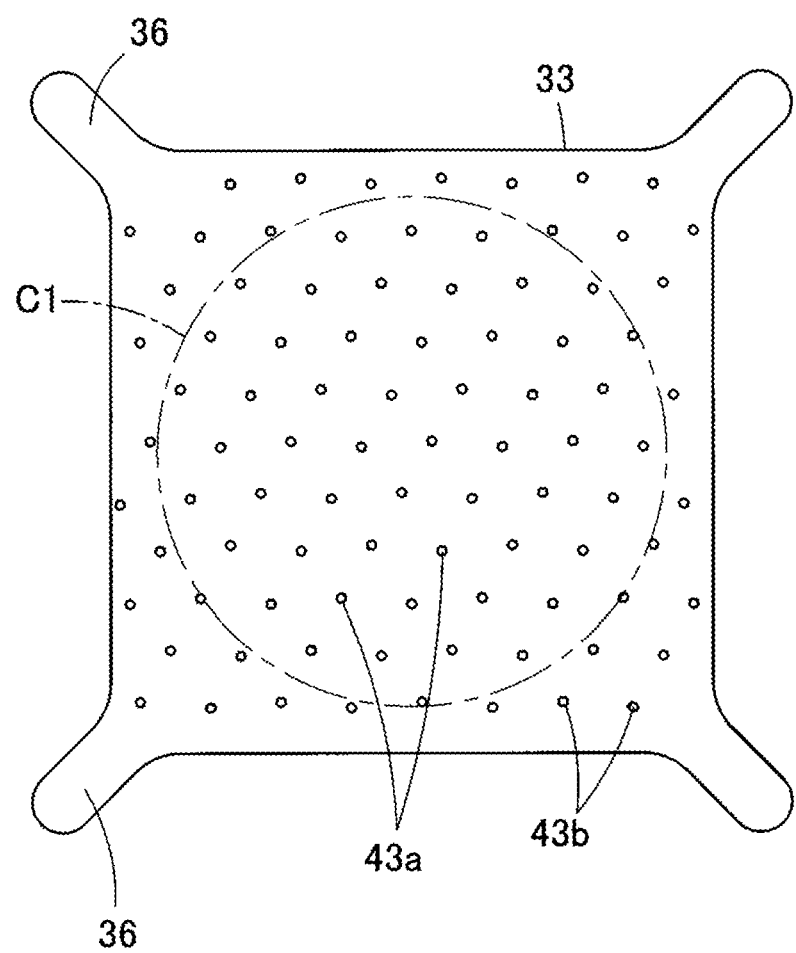
FIG. 7 illustrates the boundaries of a stopper with short protruding length and a stopper with long protruding length.

FIG. 6 illustrates a distribution of the displacement of the diaphragm 33 when the diaphragm deforms due to receiving pressure. The distribution illustrated was calculated via simulation. In FIG. 6 the greater the density of the dots, the larger the displacements in that region. As can be seen from FIG. 6, the displacement at the leg piece 36 fixed by the anchor 38 and the vicinity thereof is at a minimum. The edge portions 39 at the four locations between adjacent anchors 38 have a fairly small displacement. In contrast, the displacement of the diaphragm 33 increases towards the center portion of the diaphragm 33 and the displacement is largest at the center portion of the diaphragm 33. Accordingly, as illustrated in FIG. 4, the stoppers 43b having a long protrusion length are provided at a region opposite the leg piece 36 and the vicinity thereof (the less compliant region of the diaphragm 33) in the acoustic sensor 31; further the stoppers 43a with the short protruding length are provided in the region opposite all other regions on the diaphragm (the more compliant region of the diaphragm 33). Further, the stoppers 43b having a long protruding length may be provided at a region opposite the edge portions 39 between the leg pieces 36 depending on the strength or the deformation state of the diaphragm 33. Specifically, as shown in FIG. 7, the stoppers 43b having a long protruding length may be provided for the entire outer periphery of the diaphragm 33. More specifically, FIG. 7 illustrates a circle C1 where the center is the center of the diaphragm 33; in the example illustrated in FIG. 7, the short stoppers 43a are provided inside the circle C1, and the long stoppers 43b are provided on the outside of the circle C1. Note that circle C1 is temporarily defined for the purpose of distributing the stoppers of differing protruding lengths.

Referring to the acoustic sensor 31, short stoppers 43a are provided at locations where there is a large amount of displacement in the diaphragm 33, and the longer stoppers 43b are provided at locations where there is a small amount of displacement in the diaphragm 33; therefore it is possible to improve the anti-sticking property of the diaphragm 33, while simultaneously improving the anti-breaking property of the diaphragm 33. The reasoning for this is described in more detail with reference to FIG. 8.

Figure 8:
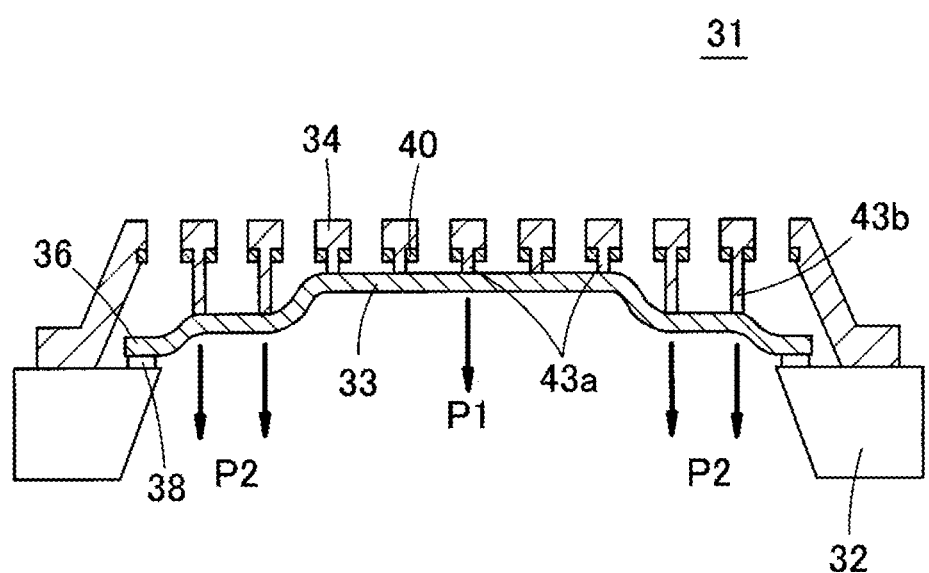
FIG. 8 is an explanatory diagram regarding the functional effects of the acoustic sensor according to the first embodiment.

FIG. 8 illustrates a case where a large load is applied to the diaphragm 33 in the acoustic sensor 31; a large load may be applied to the diaphragm when for instance, the acoustic sensor 31 is dropped during a drop test and the like; a large amount of air is taken into the acoustic sensor 31; a large amount of air is blown into the holes in the acoustic sensor 31, or a loud sound impinges on the acoustic sensor 31. The diaphragm 33 may stick to the back plate 34 because of the center portion of the diaphragm undergoing a large amount of displacement; however the short stoppers 43a are provided at the center portion of the back plate 34 and thus there is a comparatively large distance between the center portion of the diaphragm 33 and the stoppers 43a. Therefore, when a large load is applied to the diaphragm 33 and the diaphragm 33 comes in contact with the tip of the stoppers 43a, the elastic restorative force P1 of the diaphragm 33 is large because of the large deformation of the diaphragm 33, thus facilitating the diaphragm 33 pulling away from the stopper 43a and making the diaphragm 33 less likely to stick.

Figure 2A:
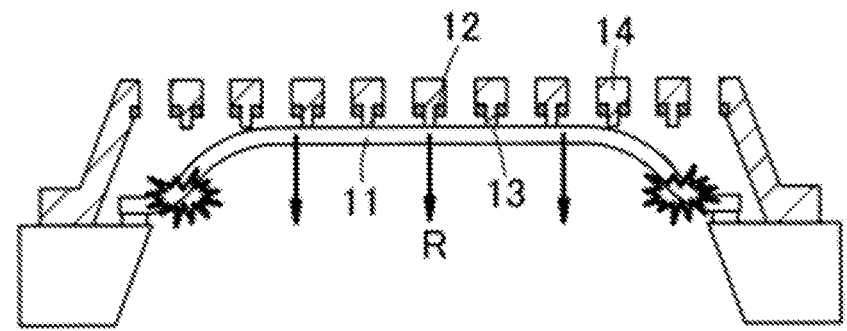
FIG. 2A is a schematic cross-sectional view illustrating an acoustic sensor with short stoppers.
Figure 2B:
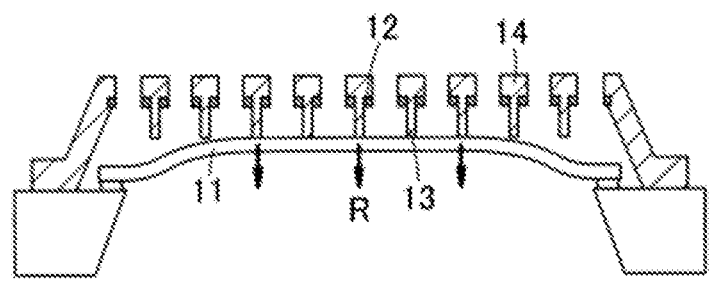
FIG. 2B is an outline cross-sectional view illustrating an acoustic sensor with long stoppers.

Furthermore, when the stoppers 43b are short like the stoppers 43a, if the diaphragm 33 is subject to a large load, the diaphragm 33 deforms to a large extent. The area near the portion fixed by the anchor 38 also deforms to a large extent and stress concentrates in this area, leading to a possibility that the diaphragm breaks or tears (refer to FIG. 2A).

However, in the acoustic sensor 31 according to the first embodiment, the stopper 43b is made longer. Therefore even when a large load is applied to the diaphragm 33 and the diaphragm 33 is about to undergo a large deformation, as illustrated in FIG. 8, the diaphragm 33 abuts the stopper 43b. The stopper 43b suppresses deformation of the diaphragm 33 near the fixed portions. The longer stopper 43b thus prevents tearing near the fixed portion of the diaphragm and at the anchors 38, and prevents the diaphragm 33 from breaking. Thus, the acoustic sensor 31 according to the first embodiment provides a diaphragm 33 with both an anti-sticking and an anti-breaking property, as opposed to the conventional examples.

Additionally, the diaphragm 33 is allowed to undergo a large deformation because the shorter stopper 43a creates a large distance between the diaphragm 33 and the stopper 43a at the center portion of the diaphragm 33, thus providing the acoustic sensor 31 with a wider dynamic range.

As can be understood from the above mentioned effects, the stoppers 43b must be a length that allows the diaphragm 33 to come in contact with the stoppers 43b before the diaphragm 33 undergoes a deformation large enough to cause any tears or fatigue to occur in the vicinity of the fixed portions. On the other hand, the vicinity of the fixed portions of the diaphragm 33 should not be fixed by the stopper 43b. Therefore the undeformed diaphragm 33 and the tip of the stoppers 43b should have a suitable amount of gap therebetween.

Additionally, it is desirable for the protruding length of the stoppers 43b to be adjusted such that when the diaphragm 33 abuts the stoppers 43a and the stoppers 43b the elastic restorative force P2 near the fixed portion of the diaphragm 33 is substantially equivalent to the elastic restorative force P1 at the center portion of the diaphragm 33.

Figure 9:
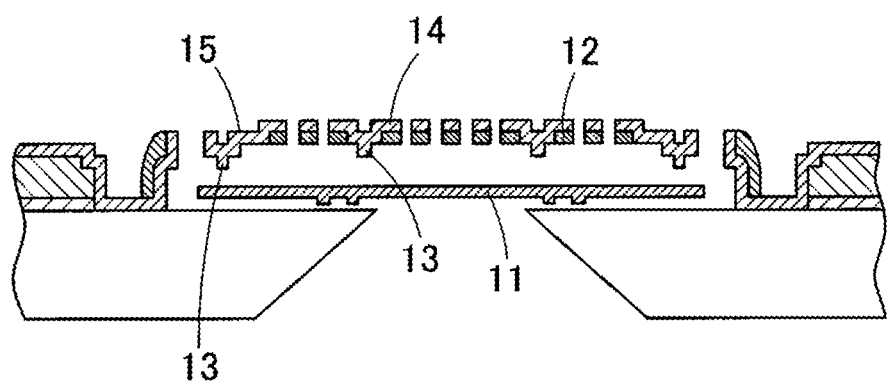
FIG. 9 is a cross-sectional view of an acoustic sensor according to a different conventional example.

In the acoustic sensor disclosed in Japanese Unexamined Patent Application Publication No. 2010-74523, as illustrated in FIG. 9, the height of the tip of the stopper 13 measured from the top surface of the fixed electrode plates 12 is lower at the outer periphery of the diaphragm 11, and is higher at the center portion of the diaphragm 11.

However, the protruding lengths of the stoppers 13 are the same length whether the stoppers 13 are at the outer peripheral portion or the center portion of the diaphragm 11. Therefore, a step portion 15 lower than the center portion must be formed at the outer periphery of the back plate 14 in order to make the height of the tip of the stopper 13 lower at the outer peripheral portion of the diaphragm 11 and higher at the center portion of the diaphragm 11. As a result, the signal-to-noise ratio of the acoustic sensor tends to worsen due to the influence of thermal noise because the spacing between the back plate 14 and the diaphragm 11 narrows at the step portion 15. Additionally, the contact surface area between the back plate 14 and the diaphragm 11 becomes larger due to the narrower spacing between the back plate 14 and the diaphragm 11 at the step portion 15, and thus the diaphragm 11 may tend to stick during the production of the acoustic sensor or during high-temperature and high humidity tests. Given that a step-like curved portion is created on the back plate 14, when the diaphragm 11 is subject to a pressure resulting in a large load on the diaphragm 11, the stress concentrates at the step-like curved portion becoming a probable cause for the back plate to break. Moreover, the creation of the step-like curved portion reduces the surface area on which the acoustic holes can be distributed. The acoustic sensor described in Japanese Unexamined Patent Application Publication No. 2010-74523 is prone to these issues; however, the acoustic sensor 31 according to the first embodiment includes stoppers 43a, 43b with different protruding lengths and therefore there is no need to provide a step portion on the back plate 34 and thus may be advantageous over the acoustic sensor described in the Japanese Unexamined Patent Application Publication No. 2010-74523.

Next, the boundary between the region where the stoppers 43a are provided, and the region where the stoppers 43b are provided is described. Here, assume that an acoustic sensor where the distance from the center O of the diaphragm 33 up to the fixed point Q (the end of the anchor 38) at a leg piece 36 is R (measuring for example, 400 μm), and that the protruding length of the stoppers is uniform over the entire diaphragm.

Figure 10:
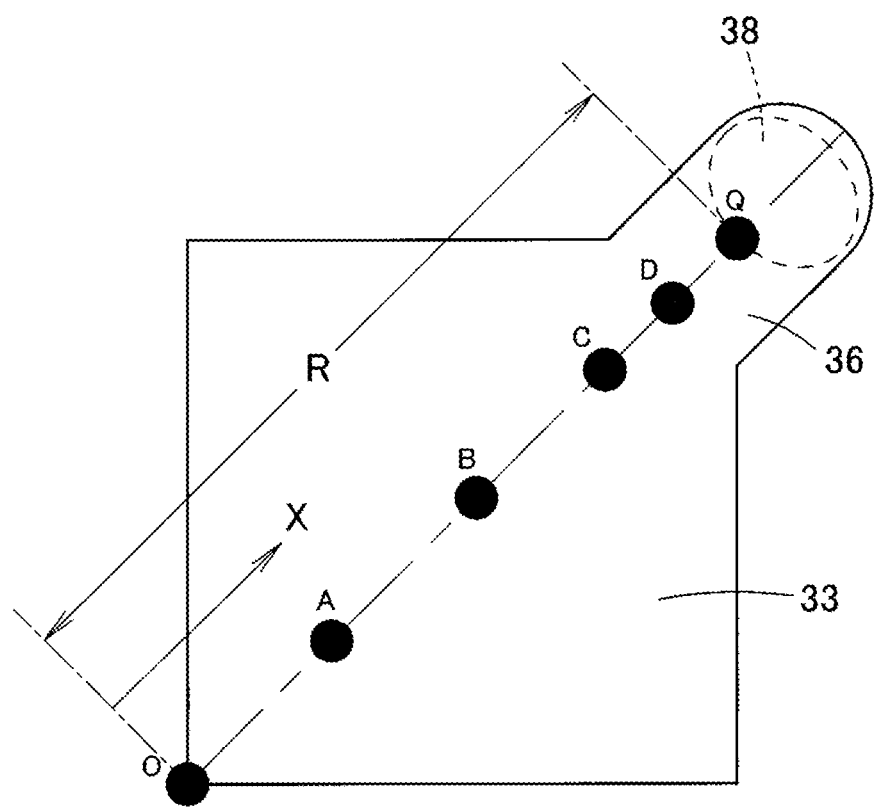
FIG. 10 illustrates one fourth of the diaphragm and points A to D on the diaphragm.
Figure 11:
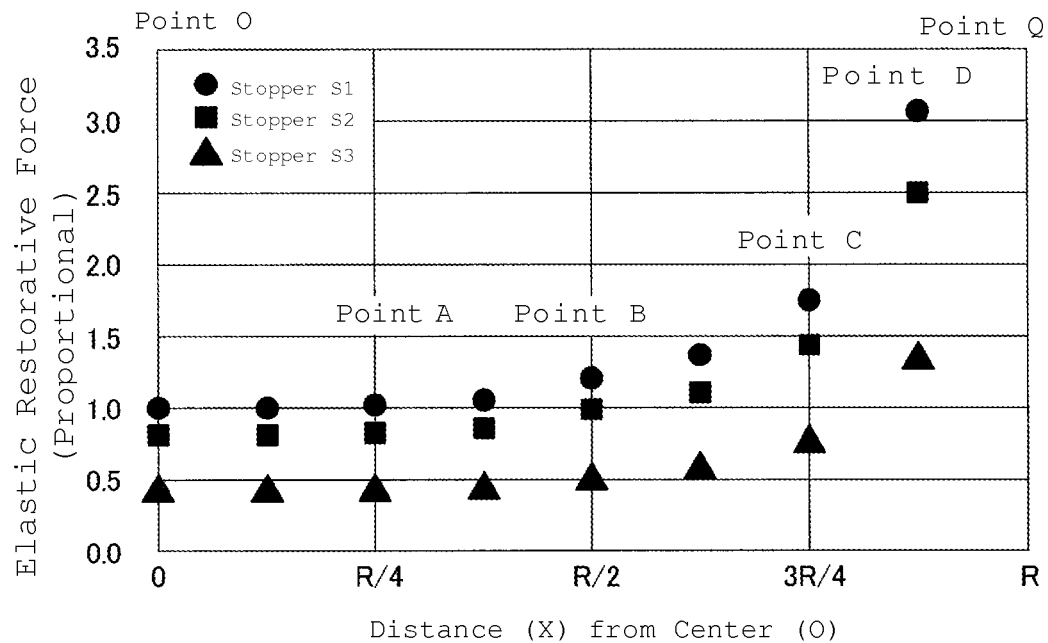
FIG. 11 illustrates the relationship between the distance from the center of the diaphragm, and the elastic restorative force of the diaphragm.

FIG. 10 illustrates a quarter portion of a diaphragm 33 in this acoustic sensor, where the points A, B, C, and D represent distances X of R/4, R/2, 3R/4 and 7R/8 respectively from the center O along a diagonal line connecting the center O of the diaphragm 33 and the fixed point Q. FIG. 11 illustrates the relationship (obtained by simulations) between the distances X measured from the center O along the diagonal line connecting the center O of the diaphragm 33 and the fixed point Q, and the elastic restorative force. The elastic restorative force at each portion is calculated via simulation; more specifically the elastic restorative force of each portion is the time between the diaphragm flexing and the region from the center O to the radius R/4 abutting the stopper. The elastic restorative force is calculated by simulating the elastic restorative force at each portion when the diaphragm is flexed to cause the region from the center O to the radius R/40 to abut the stopper.

The circles in FIG. 11 represent a sample when short stoppers S1 (for example, stoppers with a protruding length of 1 μm) are provided in the acoustic sensor where all stoppers with the same protruding length. The squares in FIG. 11 represent a sample when stoppers S2 having a protruding length 1.5 times larger than the length of the stoppers S1 are provided in the acoustic sensor where all the stoppers have the same protruding length. The triangles in FIG. 11 represent a sample when stoppers S3 having a protruding length 2.5 times larger than the length of the stoppers S1 are provided in the acoustic sensors where all the stoppers have the same protruding length. The vertical axis in FIG. 11 represents the elastic restorative force by proportion. The proportional elastic restorative force is represented by a ratio F/Fo of each elastic restorative force F in the acoustic sensors having the stoppers S1, S2, S3 respectively to the elastic restorative force Fo at the center of the acoustic sensor including the stopper S1.

As can be understood from FIG. 11, in all the samples of stoppers S1 to S3, the elastic restorative force increases suddenly past the point B where the distance X from the center O is R/2.

Accordingly, in one or more embodiments of the present invention, the protruding length of the stoppers is increased in the region past a radius of R/2 where the point O is the center, to improve the anti-sticking property and the breaking strength of the diaphragm 33.

Figure 12:
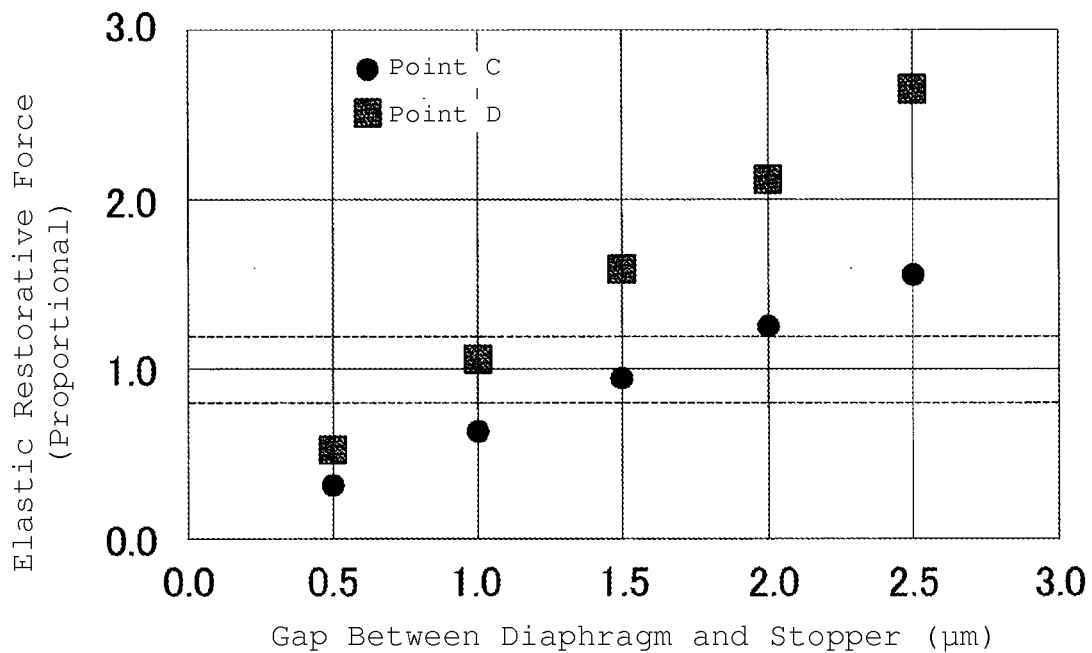
FIG. 12 illustrates the relationship between the gap between the stopper and the diaphragm, and the elastic restorative force of the diaphragm.

FIG. 12 is a graph representing the elastic restorative force at point C and point D in FIG. 10 respectively when the spacing between the diaphragm and the stopper changes from 0.5 μm to 2.5 μm (here, the elastic restorative force is the ratio when the elastic restorative force at the center O of the acoustic sensor including the stopper S1 is 1). The dotted lines shown in FIG. 12 represent a range of the elastic restorative force according to one or more embodiments of the present invention. The range according to one or more embodiments of the present invention improves the strength of the diaphragm by extending the protruding length of the stoppers while keeping an elastic restorative force equivalent to the elastic restorative force of the sample having the stopper S1.

Accordingly, in one or more embodiments of the present invention, from FIG. 12 it can be seen that the spacing between the diaphragm and the long stoppers 43b is 0.75 μm to 1.95 μm inclusive. However, in some cases, the spacing between the diaphragm and the long stoppers 43b may be greater than or equal to 1.95 μm, as long as the elastic restorative force is greater than 1 in the region beyond the point of R/2 away from the point O.

Figure 13:
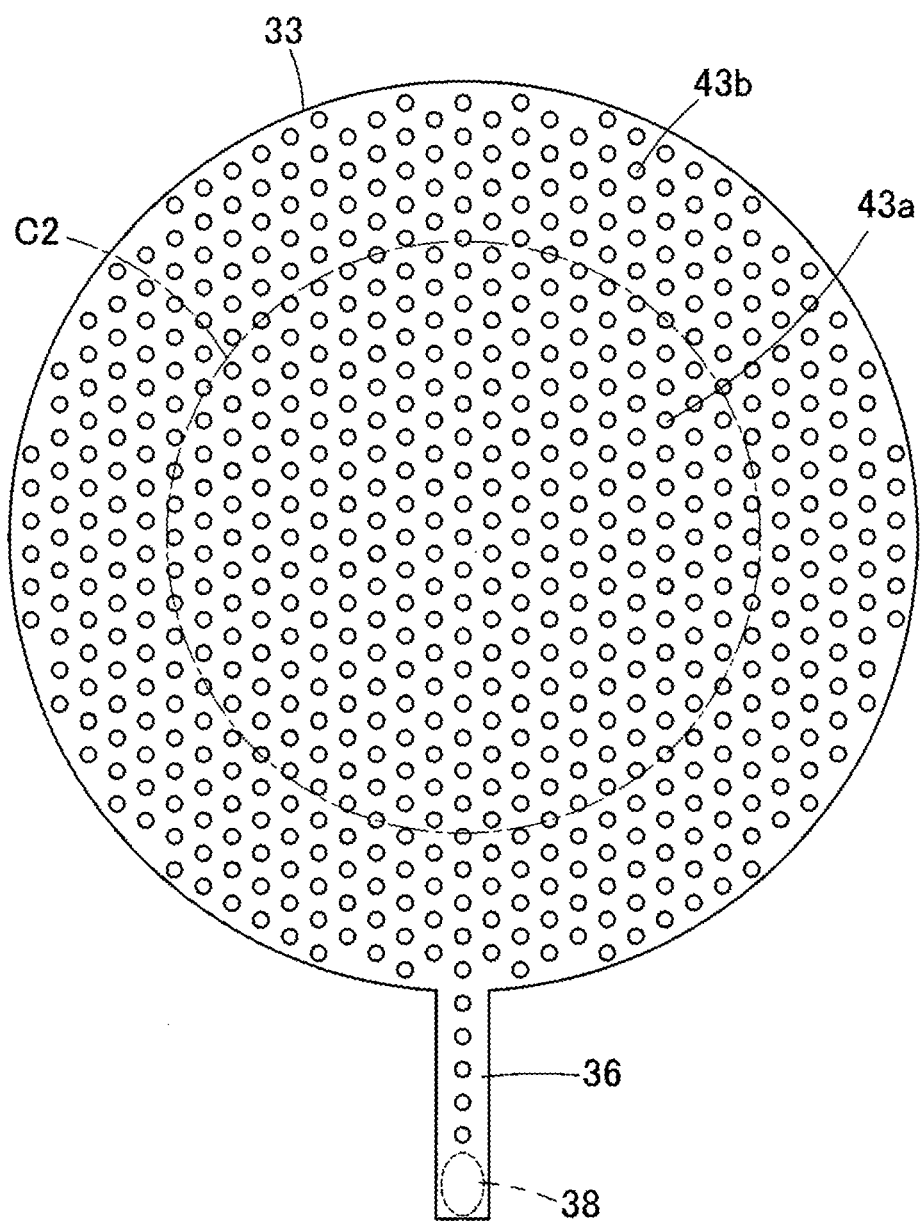
FIG. 13 illustrates a diaphragm with a different shape and the positions of the stoppers.

The diaphragm is not limited to being a substantially square shape as described above, and may be for example a circular plate. FIG. 13 illustrates the arrangement of a circular diaphragm 33 and stoppers 43a, 43b placed opposite the diaphragm 33. The leg pieces 36 extend from the circular diaphragm 33, and the anchors 38 fix the ends of the leg pieces 36.

Accordingly, the diaphragm 33 is supported by the leg piece 36 in a cantilevered manner. When this kind of cantilevered diaphragm 33 is displaced, the stress concentrates at the leg piece 36 and the region surrounding the leg piece; the stoppers 43b are therefore provided at the leg piece 36 and the vicinity of the leg piece and, according to one or more embodiments of the present invention, the stoppers have a longer protruding length. Alternatively, the short stoppers 43a may be provided inside the circle C2 illustrated in FIG. 13, and the long stoppers 43b may be provided outside the circle C2.

Figure 14A:
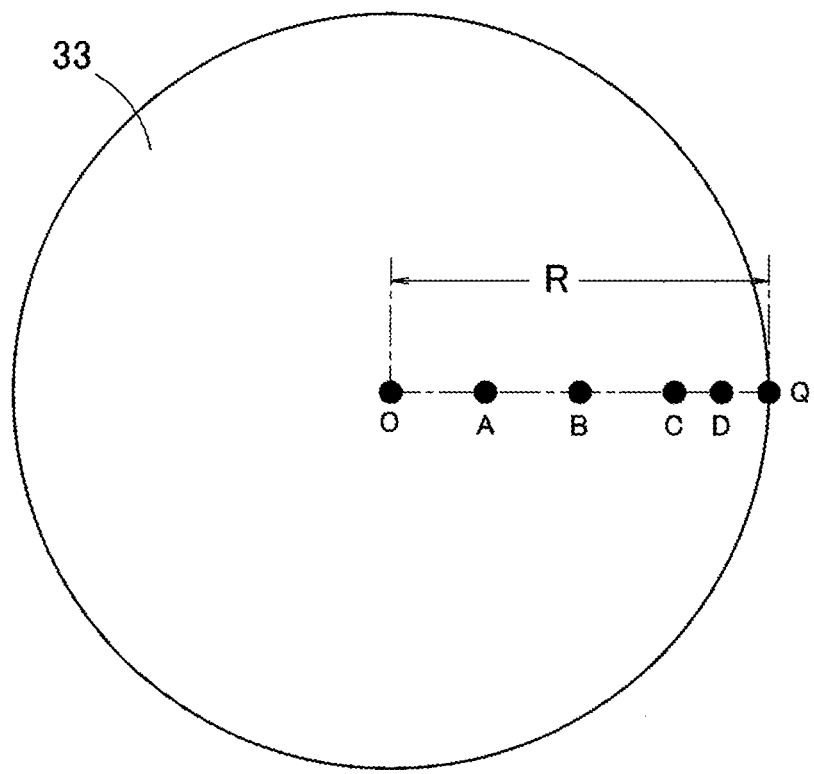
FIG. 14A illustrates points A to D on a circular diaphragm.
Figure 14B:
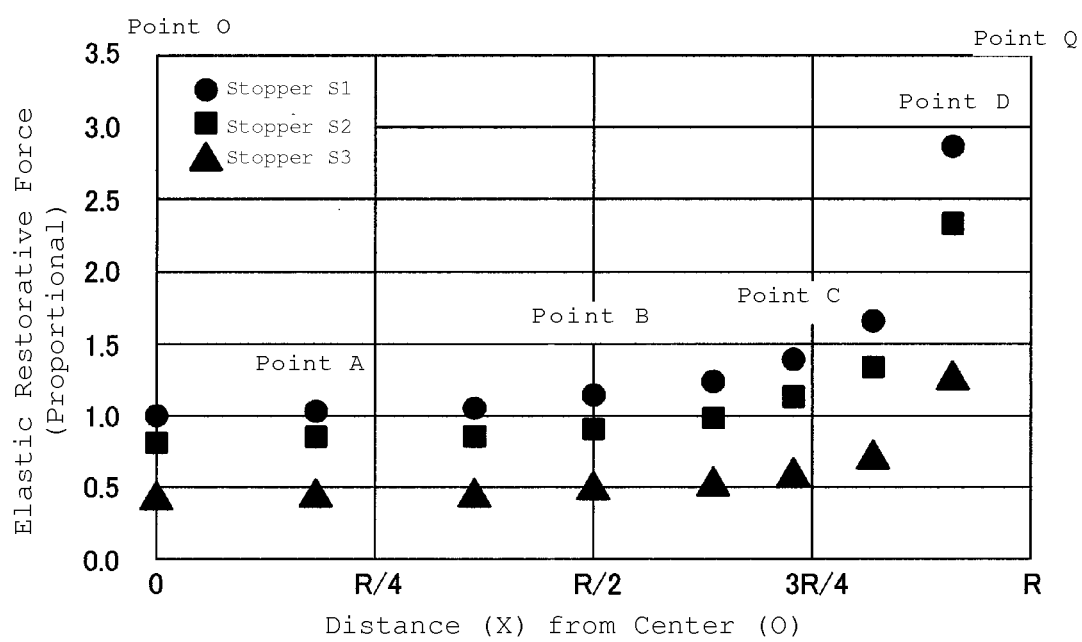
FIG. 14B illustrates the relationship between the distance from the center of the diaphragm illustrated in FIG. 14A and the elastic restorative force of the depressed diaphragm.

FIG. 14A illustrates a circular diaphragm 33 having the outer periphery thereof fixed. The circles illustrated in FIG. 14B represents the magnitude of the elastic restorative force at each point along the radius connecting the center O of the diaphragm 33 and the edge (fixed point) Q when stoppers S1 are arranged opposite the entire surface of the diaphragm 33. The squares illustrated in FIG. 14B represent when stoppers S2 are arranged opposite the entire surface of the diaphragm 33. The triangles illustrated in FIG. 14B represent when the stoppers S3 are arranged opposite the entire surface of the diaphragm 33. However, it is assumed in all these cases that the radius of the diaphragm 33 is R, and the region of radius R/4 is displaced and comes into close contact with the stoppers.

Referring to FIG. 14B, it can be understood that even for a circular diaphragm 33 when the radius of the circular diaphragm 33 is R, in one or more embodiments of the present invention, the short stoppers 43a are provided within a circle of radius R/2, and the long stoppers 43b are provided outside the circle similar to a substantially square diaphragm 33 (refer to FIG. 11).

Method for Manufacturing the First Embodiment

Next, a method of manufacturing the acoustic sensor 31 of the first embodiment is described with reference to FIG. 15 and FIG. 16. Both FIG. 15 and FIG. 16 illustrate an exploded partial view of the acoustic sensor during the manufacturing process.

Figure 15A:
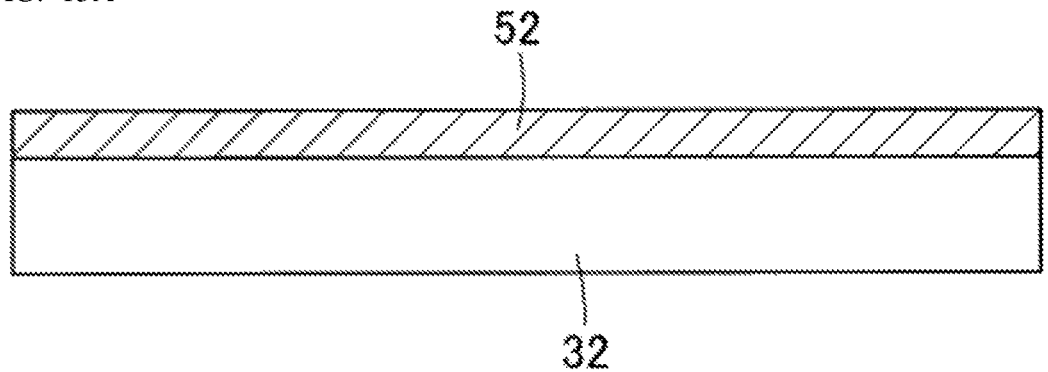
FIG. 15A to FIG. 15D are cross-sectional views illustrating processes for manufacturing an acoustic sensor according to the first embodiment.
Figure 15B:
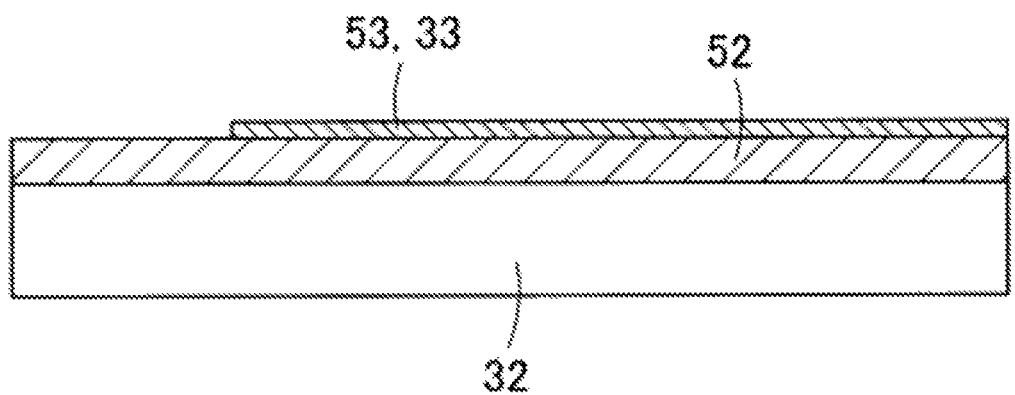

First, as illustrated in FIG. 15A, an oxide film 52 is laminated (SiO2) over the entire upper surface of the substrate 32 (Si substrate). Subsequently, as illustrated in FIG. 15B, a polysilicon film 53 is laminated over the oxide layer 52, and the polysilicon film 53 is etched to form the diaphragm 33 on the upper surface of the oxide film 52 (descriptions of the mask formation and removal processes for etching are omitted here and from the following explanations).

Figure 15C:
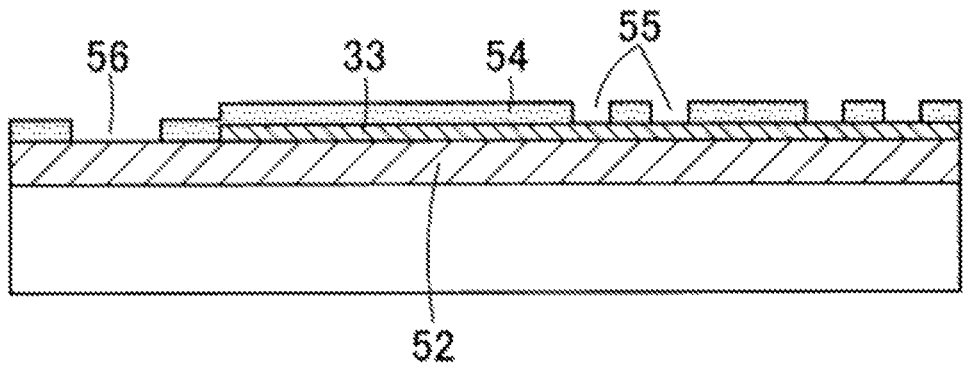

As illustrated in FIG. 15C, a first sacrificial layer 54 composed of silicon oxide film is laminated over the entire upper surface of the oxide film 52 and the diaphragm 33. Next, the first sacrificial layer 54 is etched until the diaphragm 33 is exposed at the locations where the short stoppers 43a will be provided, to form a recess 55 in the first sacrificial layer 54.

The diaphragm 33 operates as an etching stopper layer when creating the recess 55, therefore the film thickness of the first sacrificial layer 54 determines the depth of the recess 55. At the same time, the first sacrificial layer 54 is etched until the oxide film 52 is exposed so that a relatively wide disc-like opening 56 appears in the first sacrificial layer 54 along the region surrounding the diaphragm 33 (the regions where the back plate 34 contacts the substrate 32).

Figure 15D:
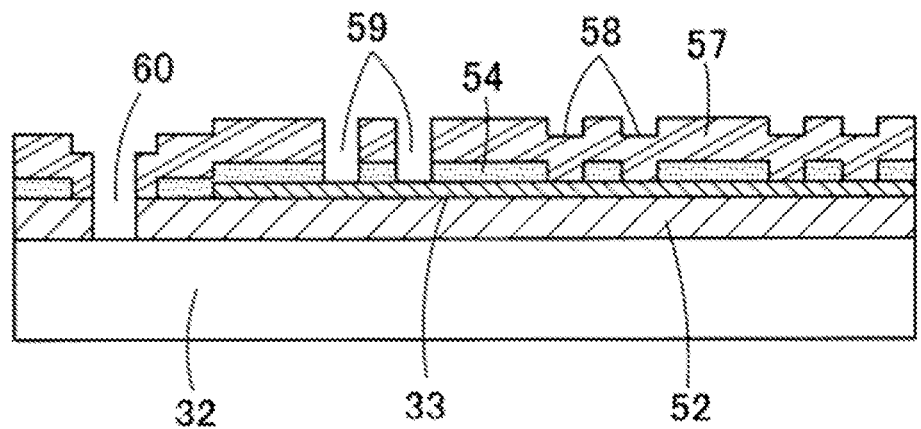

As illustrated in FIG. 15D, a second sacrificial layer 57 composed of silicon oxide film is laminated over the first sacrificial layer 54. At this point, a recessed portion 58 appears in the second sacrificial layer 57 at the locations of the recess 55. The second sacrificial layer 57 and the first sacrificial layer 54 are etched until the diaphragm 33 is exposed at the locations where the long stoppers 43b will be provided above the diaphragm 33, to open through holes 59 through the second sacrificial layer 57 and the first sacrificial layer 54. When opening the through holes 59, the diaphragm 33 operates as an etching stop layer, and the sum of the thicknesses of the first sacrificial layer 54 and the second sacrificial layer 57 determine the depth of the through holes 59. The second sacrificial layer 57 and the oxide film 52 are also etched at the region at which the opening 56 is provided until the substrate 32 is exposed, to create a groove 60 that is narrower than the opening 56 in the second sacrificial layer 57 and the oxide film 52.

Figure 16A:
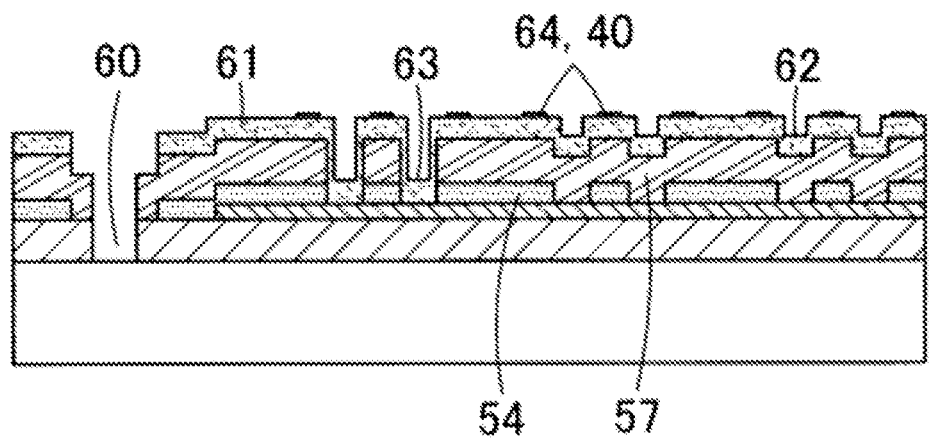
FIG. 16A to FIG. 16C are continuation processes after FIG. 15D.

A third sacrificial layer 61 composed of silicon oxide film is further laminated over the second sacrificial layer 57 as illustrated in FIG. 16A; the third sacrificial layer 61 laminated into the inner portion of the groove 60 may be removed by etching the third sacrificial layer 61. Laminating the third sacrificial layer 61 over the second sacrificial layer 57 creates a recessed portion 62 in the third sacrificial layer 61 at the location of the recessed portion 58, and the recessed portion 63 in the third sacrificial layer 61 at the location of the through hole 59. A polysilicon film 64 may also be laminated over the upper surface of the third sacrificial layer 61; the polysilicon film 64 may be etched to create a pattern and thus form the fixed electrode plate 40.

Figure 16B:
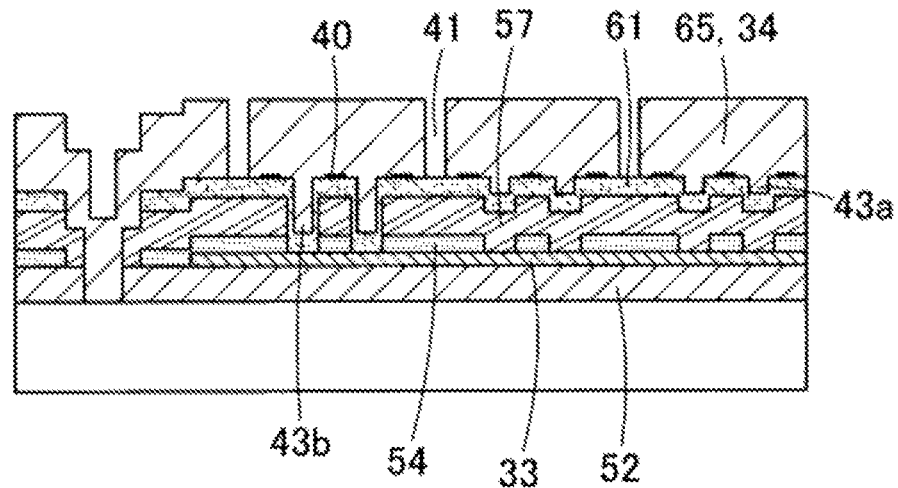

As illustrated in FIG. 16B, a silicon nitride film 65 is laminated over the third sacrificial layer 61 and the fixed electrode plate 40 to form the back plate 34. When forming the back plate, the silicon nitride film 65 laminated inside the recessed portion 62 forms the short stoppers 43a on the under surface of the back plate 34, and the silicon nitride film 65 laminated into the recessed portion 63 forms the long stoppers 43b on the under surface of the back plate 34. Additionally, the silicon nitride film 65 laminated into the groove 60 forms the supporting portion for the back plate 34. Finally, the back plate may be etched to open a plurality of acoustic holes 41 into the back plate 34.

Figure 16C:
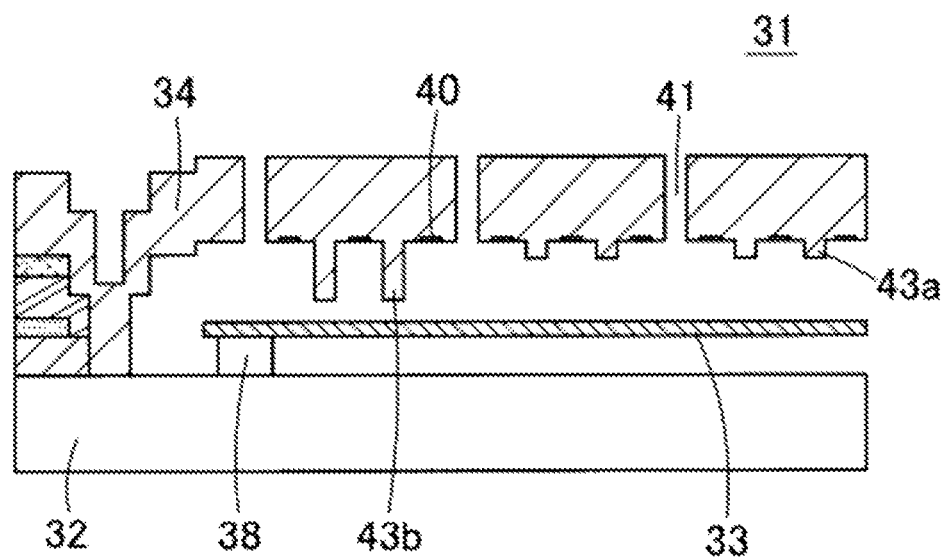

As illustrated in FIG. 16C, an etchant is subsequently introduced from the acoustic holes 41 through to the under surface of the back plate 34 to remove the third sacrificial layer 61, the second sacrificial layer 57, and the first sacrificial layer 54; this forms a space between the back plate 34 and the substrate 32. However, the etching is stopped with a portion of the first sacrificial layer 54 remaining at the under surface of the leg piece 36 of the diaphragm 33; the remaining first sacrificial layer 54 forms the anchor 38. While not illustrated, the substrate 32 may be etched from the under surface to provide a cavity 35 in the substrate 32 to complete the acoustic sensor 31.

The above described manufacturing method can produce an acoustic sensor 31 equipped with a plurality of types of stoppers having different protruding lengths without increasing the number of manufacturing processes for the acoustic sensor 31.

Moreover, the acoustic sensor 31 is easier to design because the protruding length of the short stoppers 43a is determined by the film thickness of the first sacrificial layer 54, and the protruding length of the long stoppers 43b is determined by the sum of the film thicknesses of the first sacrificial layer 54 and the second sacrificial layer 57.

Second Embodiment

Figure 17:
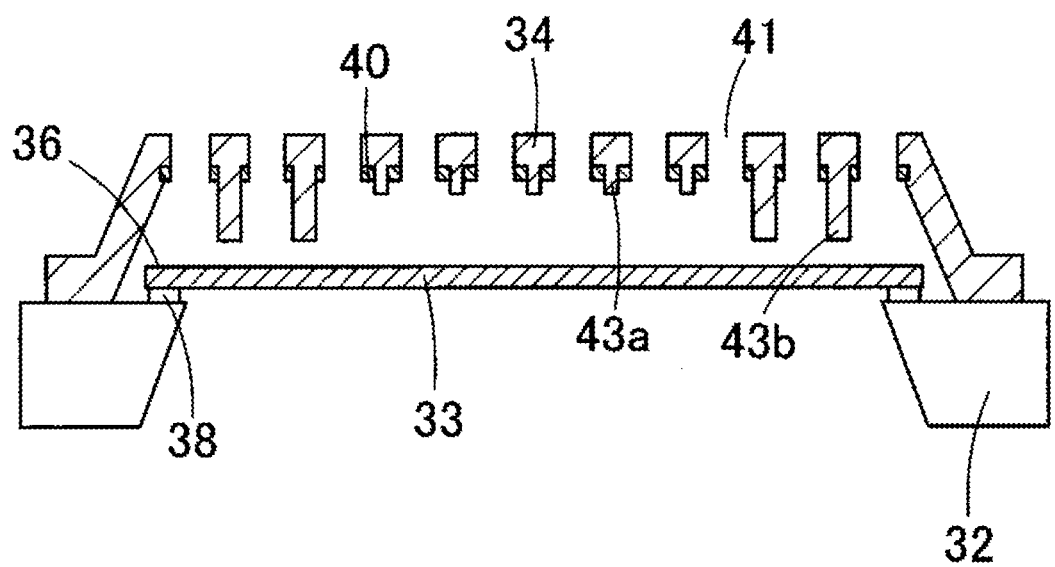
FIG. 17 is a schematic cross-sectional view illustrating an acoustic sensor according to a second embodiment.

FIG. 17 is a cross-sectional view of an acoustic sensor 71 according to a second embodiment. In the second embodiment, the stoppers 43b are thicker (a larger diameter) than the stoppers 43a. The stress concentrates at the portion of the stoppers 43b in contact with the diaphragm 33. Therefore it is desirable to ensure that the long stoppers 43b have a larger diameter, thereby increasing the contact surface area of the stoppers 43b and dispersing the stress at the contact surface.

Third Embodiment

Figure 18:
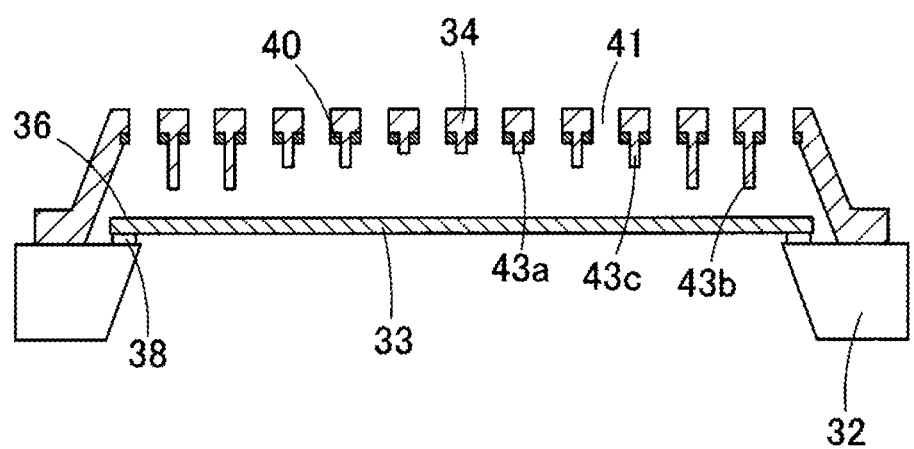
FIG. 18 is schematic cross-sectional view illustrating an acoustic sensor according to a third embodiment.

FIG. 18 is a cross-sectional view of an acoustic sensor 81 according to the third embodiment. In the third embodiment, the short stoppers 43a are provided in a region opposite the center portion of the diaphragm 33, long stoppers 43b are provided at a location opposite the outer peripheral region of the diaphragm; and stoppers 43c longer than the stoppers 43a but shorter than the stoppers 43b are provided in the annular region sandwiched between the central portion and the outer peripheral region on the diaphragm. Increasing the variations to three types of protruding lengths increases the locations of contact when the diaphragm 33 undergoes significant deformation; the increased locations of contact also disperse the stress that concentrates on the stoppers 43a, 43b, 43c, and the anchor 38 to thereby prevent breakage at the stoppers 43a, 43b, 43c, or the diaphragm 33 or the anchor 38, and the like.

Figure 19A:
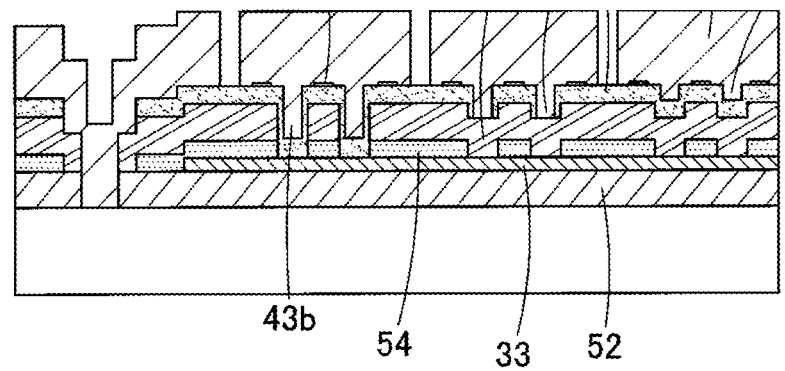
FIG. 19A to FIG. 19C are cross-sectional views illustrating a portion of processes used for manufacturing an acoustic sensor according to the third embodiment.
Figure 19B:
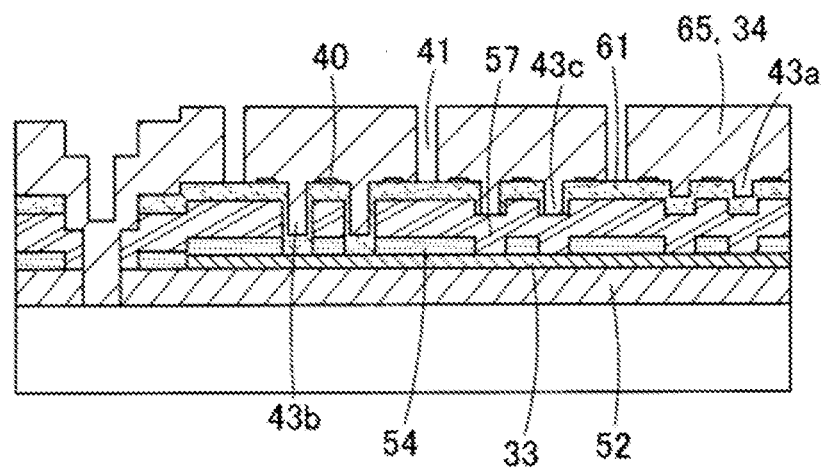
Figure 19C:
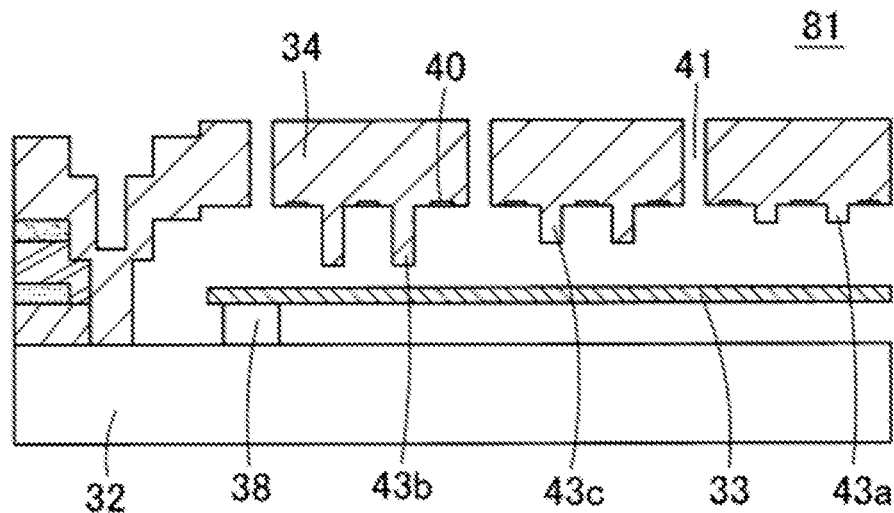

FIG. 19A to FIG. 19C illustrate a portion of manufacturing processes used to produce the acoustic sensor 81 including the stoppers 43a, 43b, 43c with three variations of protruding lengths. FIG. 19A illustrates the forming of the first sacrificial layer 54, the second sacrificial layer 57, and the third sacrificial layer 61 on the diaphragm 33. The processes of forming the acoustic sensor up to this stage are the same as those processes illustrated in FIG. 15A to FIG. 15D. However, the recess 55 in the first sacrificial layer 54, and the recessed portion 58 in the second sacrificial layer 57 are formed not only at the locations corresponding to the stoppers 43a but also at the locations corresponding to the stoppers 43c.

In the process illustrated in FIG. 19A, the third sacrificial layer 61 in the grooves 60 is removed; at the same time the third sacrificial layer 61 inside the recessed portion 58 is etched and removed from the location corresponding to the third stopper 43c to open a hole 82 in the third sacrificial layer 61. The resulting hole 82 is created at a location corresponding to the stopper 43c; the hole 82 is deeper than a recessed portion 62 which is formed at a location corresponding to the stopper 43a.

FIG. 19B and FIG. 19C illustrate the same processes illustrated in FIG. 16B and FIG. 16C. That is, as illustrated in FIG. 19B, a silicon nitride film 65 is laminated over the third sacrificial layer 61 and the fixed electrode plate 40 to form the back plate 34. On forming the back plate 34, the silicon nitride film 65 laminated into the recessed portion 62 forms the short stoppers 43a, the silicon nitride film 65 laminated into the hole 82 forms the stoppers 43c, and the silicon nitride film 65 laminated into the recessed portion 63 forms the stoppers 43b. A plurality of acoustic holes 41 is then opened into the back plate 34.

As illustrated in FIG. 19C, the third sacrificial layer 61, the second sacrificial layer 57, and the first sacrificial layer 54 are subsequently removed to form a space between the back plate 34 and the substrate 32. However, the etching is stopped with a portion of the first sacrificial layer 54 remaining at the under surface of the leg piece 36 of the diaphragm 33; the remaining first sacrificial layer 54 forms the anchor 38. While not illustrated, the substrate 32 may be etched from the under surface to provide a cavity 35 in the substrate 32 to complete the acoustic sensor 81.

Figure 20:
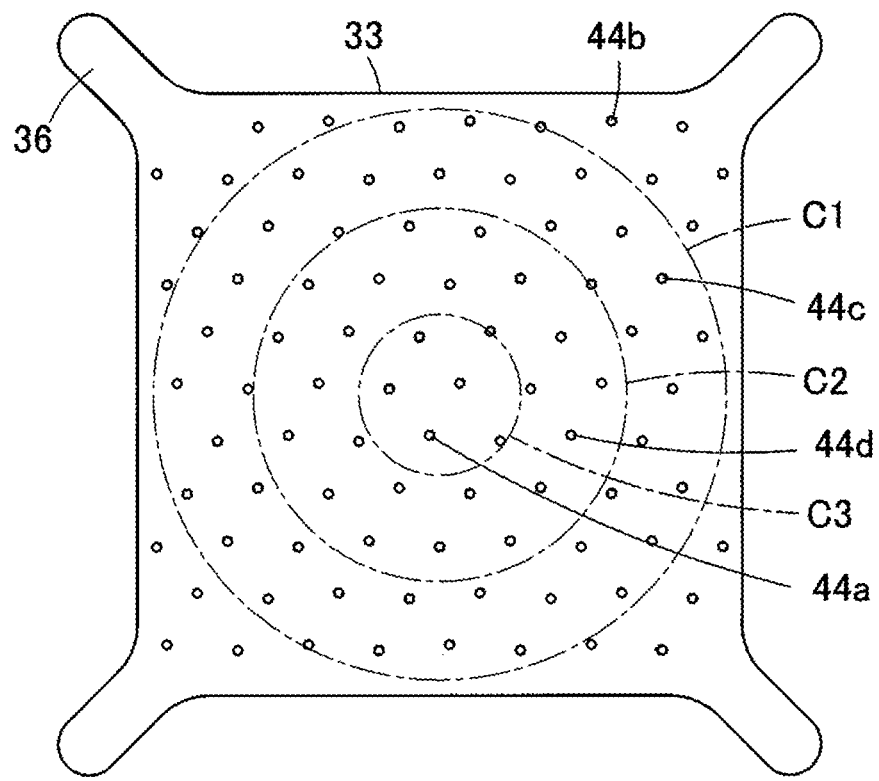
FIG. 20 illustrates a modification example of the third embodiment of the present invention.

It may be understood that a fourth type of stopper may be further provided. For instance as illustrated in FIG. 20, the shortest stoppers 43a may be provided inside a circle C3, stoppers 43d that are longer than stoppers 43a maybe provided at an inner region between the circle C3 and the circle C2, stoppers 43c longer than the stoppers 43d maybe provided in a region between the circle C2 and the circle C1, and the longest stoppers 43b longer than the stoppers 43a may be provided outside of the circle C1.

Fourth Embodiment

Figure 21:
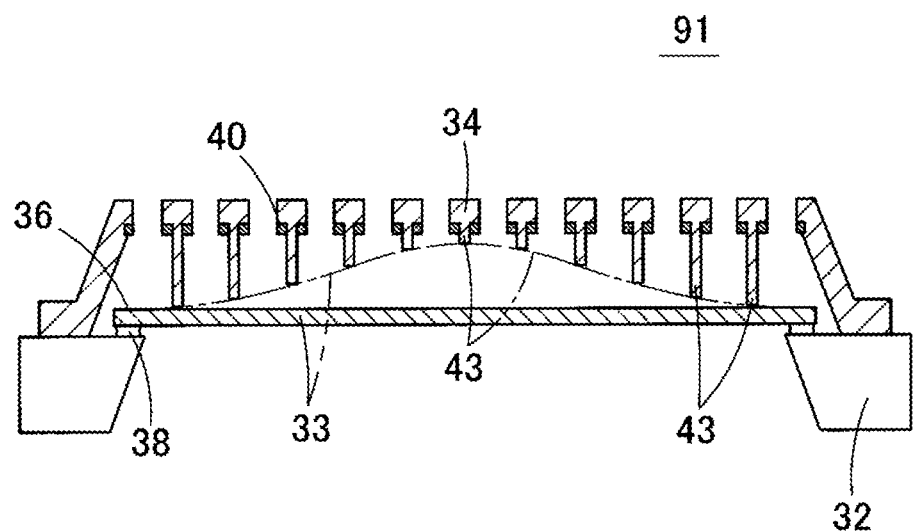
FIG. 21 is a cross-sectional view illustrating an acoustic sensor according to a fourth embodiment.

In the acoustic sensor 91 illustrated in FIG. 21, the protruding length of the stoppers 43 gradually changes. In FIG. 21 the double dashed-dot line represents the shape of the upper surface of the diaphragm 33 when the diaphragm 33 is displaced upward to a degree where no excessive amount of stress is generated. The stoppers 43 change in protruding length such that the tips of the stoppers 43 are located above the shape of the diaphragm of the double dashed-dot line. In the fourth embodiment, when the diaphragm 33 is subject to a large load, the stoppers 43 support the diaphragm in its natural shape, and thus the stress tends not to concentrate on the diaphragm 33 or the anchor 38, to further improve the anti-breaking property of the diaphragm 33.

Fifth Embodiment

Figure 22:
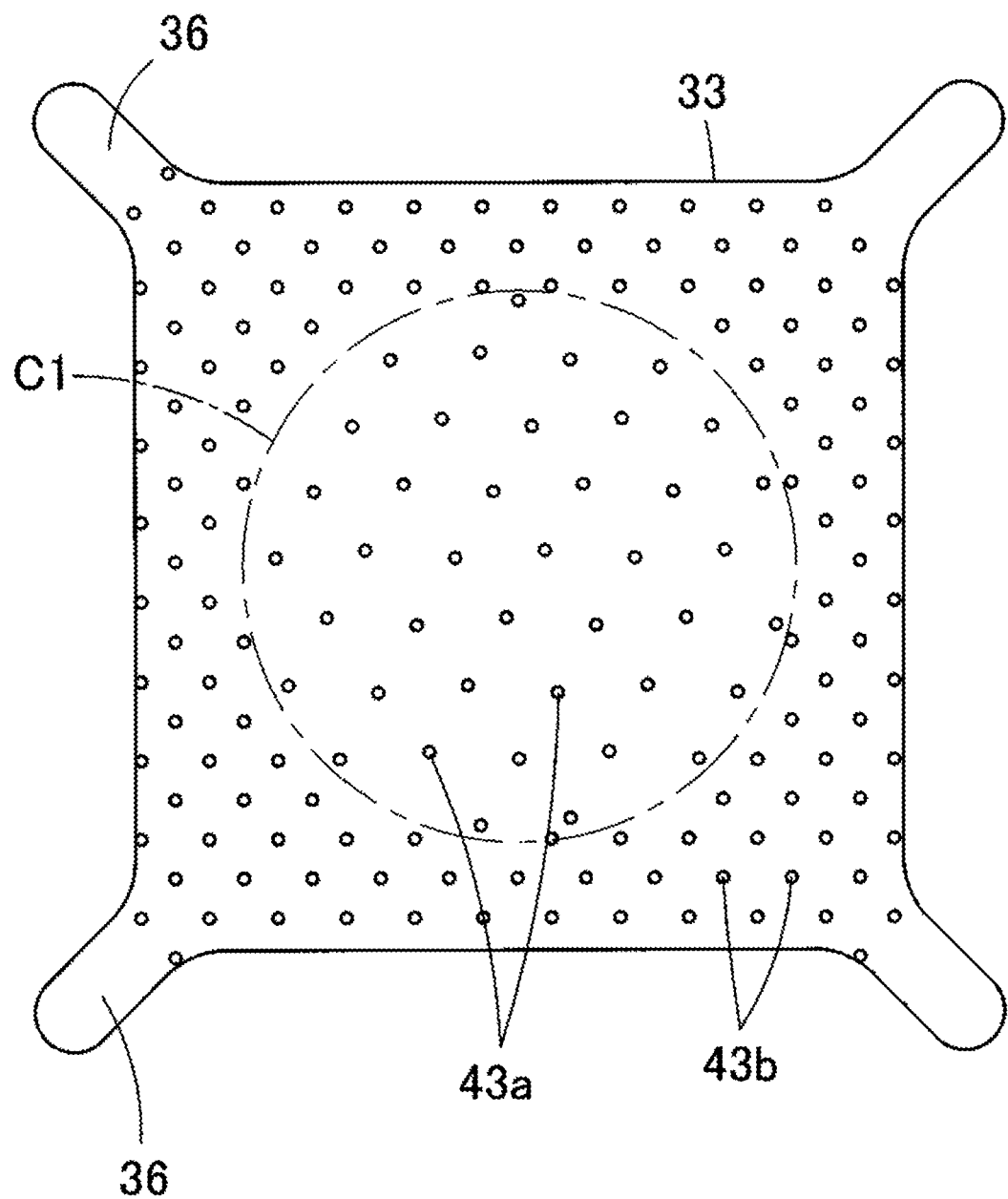
FIG. 22 illustrates a diaphragm and the arrangement of stoppers in a fifth embodiment of the present invention.

FIG. 22 is a diagram for explaining an acoustic sensor according to a fifth embodiment. FIG. 22 illustrates the arrangement of the diaphragm 33, and the stoppers 43a, 43b provided on the back plate 34. In the fifth embodiment, the number density of the stoppers 43b provided on the outer peripheral portion (outside the circle C1) is larger than the number density of the stoppers 43a provided on the inside portion (inside the circle C1). If the stoppers 43b are provided with a longer protruding length, the stress concentrates at the portion of the diaphragm 33 that makes contact with the stoppers 43b. Therefore increasing the number density of the stoppers 43b increases the contact surface area to thereby disperse the stress at the contact surface.

Sixth Embodiment

Figure 23:
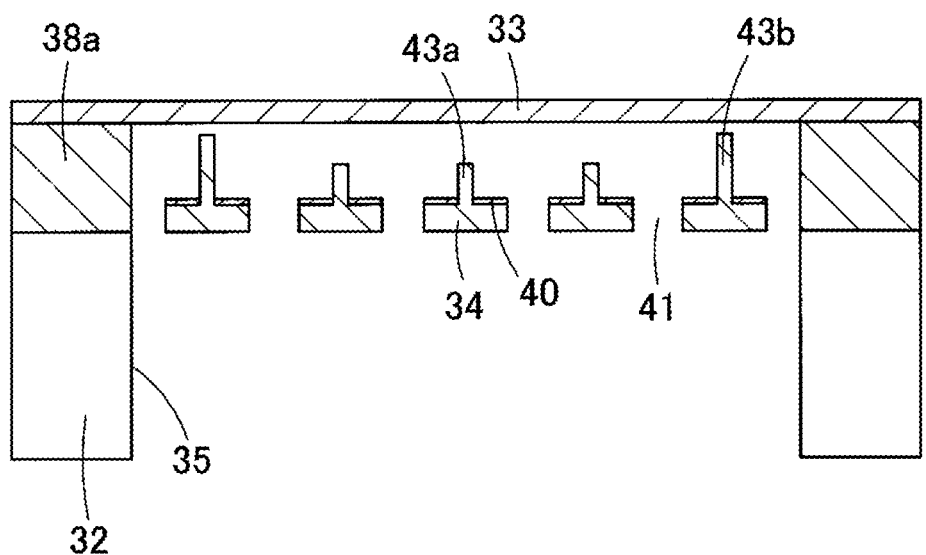
FIG. 23 is a schematic cross-sectional view illustrating an acoustic sensor according to a sixth embodiment.

FIG. 23 is a schematic cross-sectional view illustrating an acoustic sensor 101 according to the sixth embodiment. In the sixth embodiment the diaphragm 33 is provided above the fixed electrode plate 40. A flat back plate 34 is provided on the upper surface of the substrate 32. A fixed electrode plate 40 is also provided on the upper surface of the back plate 34. A plurality of acoustic holes 41 is opened in the back plate 34 and the fixed electrode plate 40 above the cavity 35. The diaphragm 33 is placed facing the fixed electrode plate 40 above the back plate 34. The diaphragm 33 is supported by an anchor portion 38a provided at the edges of the back plate 34. The stoppers 43a, 43b protrude upward from the upper surface of the back plate 34, and the stoppers 43b located at the outer peripheral portion have a longer protruding length than the stoppers 43a located at the center portion.

Seventh Embodiment

Figure 24:
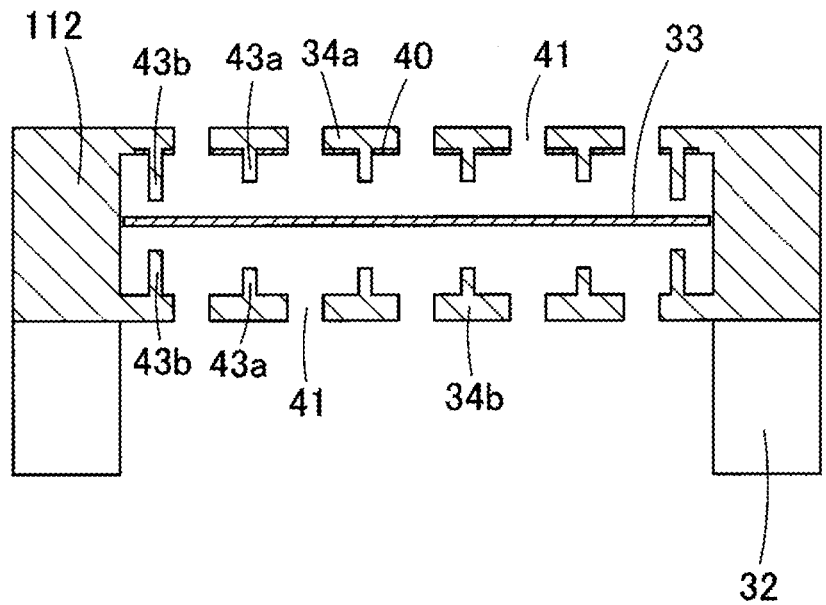
FIG. 24 is a schematic cross-sectional view illustrating an acoustic sensor according to a seventh embodiment.

FIG. 24 is a schematic cross-sectional view illustrating an acoustic sensor 111 according to a seventh embodiment. In the seventh embodiment, a plate 112 is provided on the upper surface of the substrate 32. An upper back plate 34a is formed on the upper surface of the plate 112, and a lower back plate 34b is formed on the under surface of the plate 112; a cavity is formed between the upper back plate 34a and the lower back plate 34b. The diaphragm 33 is provided between the upper back plate 34a and the lower back plate 34b in an air gap therebetween. The fixed electrode plate 40 is provided on the under surface of the upper back plate 34a. A plurality of acoustic holes 41 are opened in the upper back plate 34a; short stoppers 43a protrude from the center portion of the upper back plate 34a toward the diaphragm 33; and long stoppers 43b protrude from the outer peripheral portion of the upper back plate 34a toward the diaphragm 33. The acoustic holes 41 are also opened in the lower back plate 34b; the short stoppers 43a protrude from the center portion of the lower back plate 34b toward the diaphragm 33; and the long stoppers 43b protrude from the outer peripheral portion of the lower back plate 34b towards the diaphragm 33.

The acoustic sensor 111 not only limits the extreme displacement of the diaphragm upwards, but also limits the extreme a displacement of the diaphragm 33 downwards, and therefore further improves the anti-breaking property of the acoustic sensor 111.

Eighth Embodiment

Figure 25A:
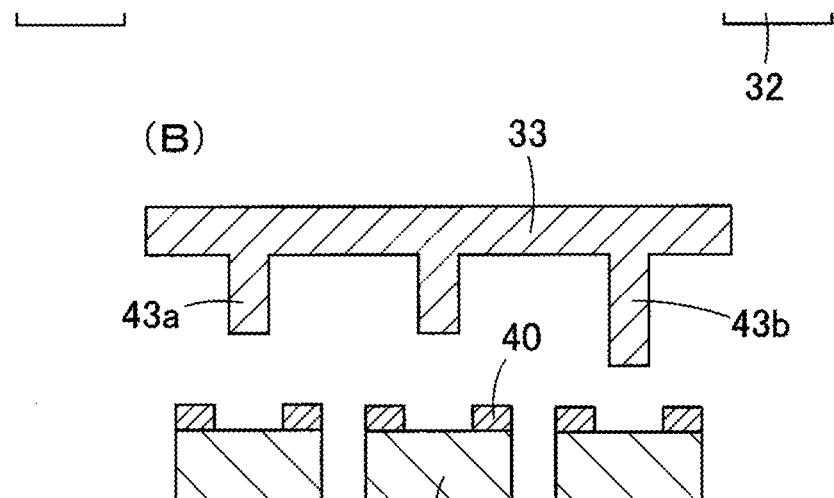
FIG. 25A is a schematic cross-sectional view of an acoustic sensor according to an eighth embodiment.

FIG. 25A is a schematic cross-sectional view illustrating an acoustic sensor 121 according to an eighth embodiment. In the eighth embodiment, a flat back plate 34 is provided on the upper surface of the substrate 32. The fixed electrode plate 40 is formed on the upper surface of the back plate 34. A plurality of acoustic holes 41 is opened in the back plate 34 and the fixed electrode plate 40 in the upper portion of the cavity 35. Additionally, the diaphragm 33 is placed opposite the fixed electrode plate 40 above the back plate 34. The diaphragm 33 is supported by an anchor portion 38a provided at the edges of back plate 34. The stoppers 43a, 43b protrude downward from the under surface of the diaphragm 33; the short stoppers 43a are provided in a region where the diaphragm 33 undergoes a large amount of displacement (for instance center portion of the diaphragm 33); and long stoppers 43b are provided in the region where the diaphragm 33 undergoes a small amount of displacement (for instance, at the outer peripheral portion of the diaphragm 33). Furthermore, an opening is provided in fixed electrode plate 40 at a location opposite the end surface of the stoppers 43a, 43b such that even if the stoppers 43a, 43b come into contact with the back plate 34 the stoppers 43a, 43b do not touch the fixed electrode plate 40.

Figure 25B:
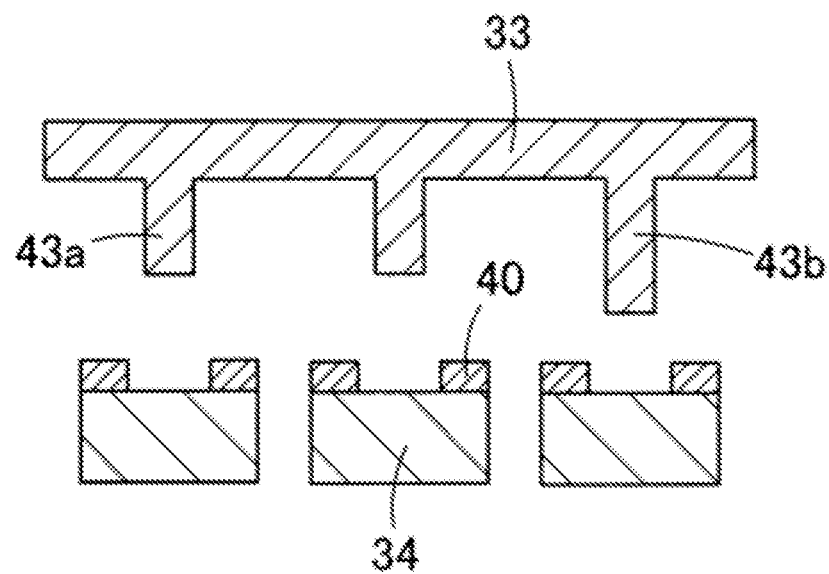
FIG. 25B is a partial exploded view of FIG. 25A.
Figure 25C:
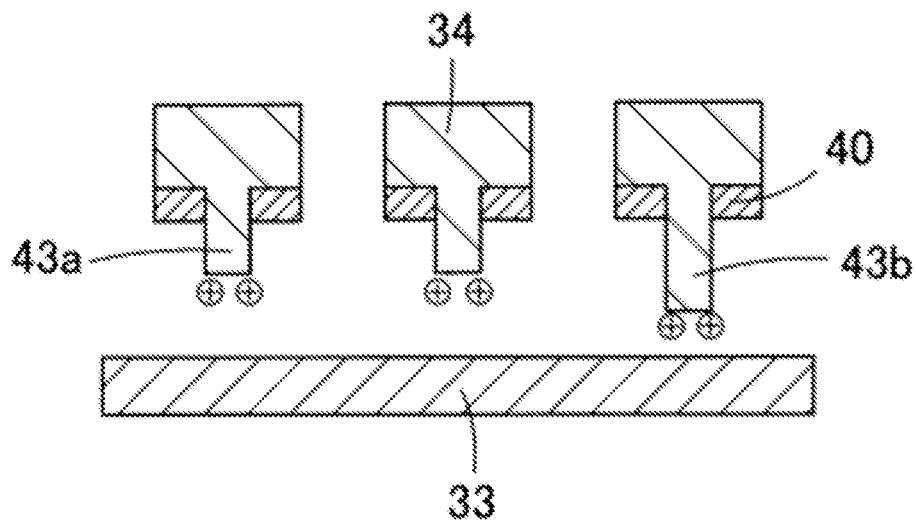
FIG. 25C is a partial exploded view of a comparative example.

As illustrated in FIG. 25C, when the stoppers 43a, 43b are provided in the back plate 34, given that the stoppers 43a, 43b are made of insulating material, the stoppers 43a, 43b are easily charged with electricity, thereby having adverse effects on the sensitivity of the acoustic sensor. In contrast, if as illustrated in FIG. 25B the stoppers 43a, 43b are provided on the conductive diaphragm 33, stoppers 43a, 43b are not easily charged with electricity to thereby prevent any change in the sensitivity of the acoustic sensor 121.

Application to Microphones

Figure 26:
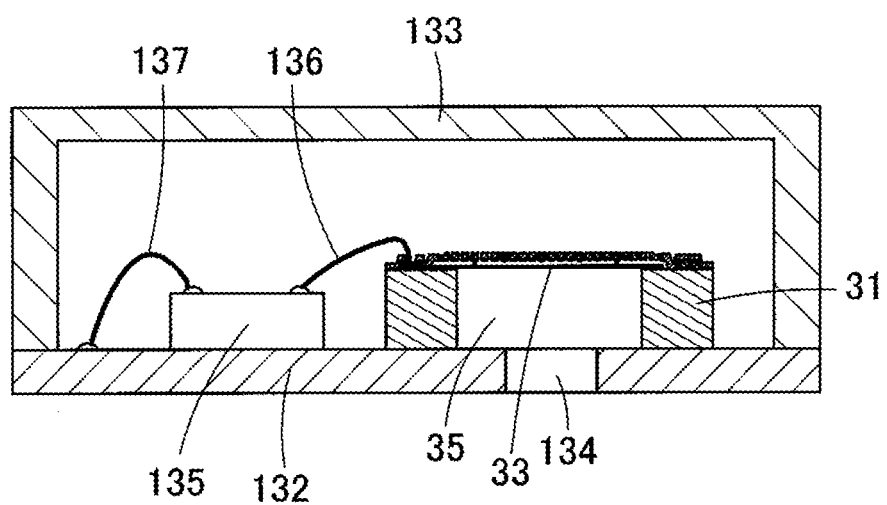
FIG. 26 is a schematic cross-sectional view illustrating a bottom port microphone with a built-in acoustic sensor according to one or more embodiments of the present invention.

FIG. 26 is a schematic cross-sectional view of a bottom port type microphone 131 with a built-in acoustic sensor such as the acoustic sensor 31 according to the first embodiment. The microphone 131 includes an acoustic sensor 31, and a signal processing circuit 135 (ASIC) in a package constituted by a circuit board 132 and a cover 133. The acoustic sensor 31 and the signal processing circuit 135 are mounted on the upper surface of the circuit board 132. A sound port 134 for introducing acoustic vibrations into the acoustic sensor 31 is opened in the circuit board 132. The acoustic sensor 31 is mounted on the upper surface of the circuit board 132 such that opening in the under surface of the cavity 35 coincides with the sound port 134 and covers the sound port 134. Therefore, the cavity 35 in the acoustic sensor 31 becomes a front chamber and the space within the package becomes a back chamber.

The acoustic sensor 31 and the signal processing circuit 135 are connected via a bonding wire 136. The signal processing circuit 135 is further connected to the circuit board 132 via a bonding wire 137. Moreover, the signal processing circuit 135 may function to provide power to the acoustic sensor 31 and to output a signal representing the variance in the capacitance of the acoustic sensor 31.

The cover 133 is attached to the upper surface of the circuit board 132 to cover the acoustic sensor 31 and the signal processing circuit 135. The package functions as a magnetic shield and protects the acoustic sensor 31 and the signal processing circuit 135 from external electrical interference or mechanical impact.

In this manner, the acoustic sensor 31 detects the acoustic vibrations entering the cavity 35 from the sound port 134; the signal processing circuit 135 amplifies and processes the detected acoustic vibrations, and subsequently outputs the result. The space inside the package acts as a back chamber in the microphone 131 and therefore, the capacity of back chamber may be increased to increase the sensitivity of the microphone 131.

Finally, the sound port 134 used to introduce the acoustic vibrations into the package may be opened in the upper surface of the cover 133. In this case, the cavity 35 in the acoustic sensor 31 becomes the back chamber, and the space inside the package becomes the front chamber.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A capacitive transducer comprising:
    a back plate including a fixed electrode;
    a diaphragm facing the back plate with an air gap interposed therebetween, the diaphragm acting as a movable electrode;
    at least a first stopper of a first protruding length; and
    a second stopper of a second protruding length,
    wherein the first and second stoppers protrude from at least either the surface on the back plate near the air gap or the surface on the diaphragm near the air gap,
    wherein the first stopper is provided at a position corresponding to a first position on the diaphragm,
    wherein the second the stopper is provided at a position corresponding to a second position on the diaphragm,
    wherein an amount of displacement of the diaphragm at the first position is greater than an amount of displacement of the diaphragm at the second position,
    wherein the protruding length of the first stopper is shorter than the protruding length of the second stopper,
    wherein the first position is a region where the diaphragm undergoes a large displacement,
    wherein the first stopper protrudes from the diaphragm at the first position,
    wherein the second position is a region where the diaphragm undergoes a small displacement, and
    wherein the second stopper protrudes from the diaphragm at a position facing the second position.

2. The capacitive transducer according to claim 1, wherein a region of the fixed electrode facing the diaphragm is configured as a flat surface.

3. The capacitive transducer according to claim 2, further comprising:
    a plurality of stoppers including first stoppers and second stoppers,
    wherein if the distance from a center of the diaphragm to the location at which the diaphragm is fixed is R,
    wherein the plurality of stoppers including the first stopper is provided inside a first region corresponding to the region of the radius R/2 with the center of the diaphragm as the center, wherein the plurality of stoppers including the second stopper is provided in a second region corresponding to an outer portion of the radius region, and wherein the protruding length of the shortest stopper in the first region is smaller than the protruding length of the longest stopper in the second region.

4. The capacitive transducer according to claim 2,
wherein the diaphragm is fixed over an entire outer periphery or at a portion of the outer periphery, and
wherein the first stopper is provided near a center of the diaphragm, and the second stopper is provided near a portion of the diaphragm that is fixed.

5. The capacitive transducer according to claim 2, wherein the second stopper is thicker than the first stopper.

6. The capacitive transducer according to claim 2, further comprising:
a plurality of stoppers including the first stoppers and the second stoppers,
wherein a number density of stoppers near the second stoppers is greater than the number density of stoppers near the first stoppers.

7. The capacitive transducer according to claim 1,
wherein the first position is at an outer peripheral portion of the diaphragm; and
wherein the second position is at a center portion of the diaphragm.

8. The capacitive transducer according to claim 1, wherein the first position is inside a circle defined on the diaphragm, and the second position is outside the circle.

9. The capacitive transducer according to claim 1, further comprising:
a plurality of stoppers including first stoppers and second stoppers,
wherein if the distance from a center of the diaphragm to the location at which the diaphragm is fixed is R,
wherein the plurality of stoppers including the first stopper is provided inside a first region corresponding to the region of the radius R/2 with the center of the diaphragm as the center,
wherein the plurality of stoppers including the second stopper is provided in a second region corresponding to an outer portion of the radius region, and
wherein the protruding length of the shortest stopper in the first region is smaller than the protruding length of the longest stopper in the second region.

10. The capacitive transducer according to claim 1,
wherein the diaphragm is fixed over an entire outer periphery or at a portion of the outer periphery, and
wherein the first stopper is provided near a center of the diaphragm, and the second stopper is provided near a portion of the diaphragm that is fixed.

11. The capacitive transducer according to claim 1 wherein the first position is a region where the diaphragm undergoes a large displacement;
the first stopper protrudes from the back plate at a position facing the first position;
the second position is a region where the diaphragm undergoes a small displacement; and
the second stopper protrudes from the back plate at a position facing the second position.

12. The capacitive transducer according to claim 1, further comprising:
a plurality of stoppers including the first stopper and the second stopper, the plurality of stoppers protruding from the back plate; and
the protruding lengths of the stoppers are selected such that the tips of the plurality of stoppers line up along the shape of the diaphragm when the diaphragm deforms.

13. The capacitive transducer according to claim 1, wherein the second stopper is thicker than the first stopper.

14. The capacitive transducer according to claim 1, further comprising:
a plurality of stoppers including the first stopper and the second stopper,
wherein a number density of stoppers near the second stopper is greater than the number density of stoppers near the first stopper.

15. An acoustic sensor comprising:
the capacitive transducer according to claim 1,
wherein acoustics holes are opened in the back plate to allow acoustic vibrations to pass therethrough.

16. A microphone comprising:
the acoustic sensor according to claim 15; and
a circuit for amplifying signals from the acoustic sensor and externally outputting the amplified signal.

* * * * *